United States Patent
Rodder et al.

(10) Patent No.: US 10,381,271 B2
(45) Date of Patent: *Aug. 13, 2019

(54) FIELD EFFECT TRANSISTOR WITH STACKED NANOWIRE-LIKE CHANNELS AND METHODS OF MANUFACTURING THE SAME

(71) Applicant: Samsung Electronics Co., Ltd., Suwon-si, Gyeonggi-do (KR)

(72) Inventors: Mark S. Rodder, Dallas, TX (US); Borna J. Obradovic, Leander, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/997,596

(22) Filed: Jun. 4, 2018

(65) Prior Publication Data

US 2018/0286764 A1    Oct. 4, 2018

Related U.S. Application Data

(63) Continuation of application No. 15/818,657, filed on Nov. 20, 2017, which is a continuation-in-part of
(Continued)

(51) Int. Cl.
*H01L 27/12* (2006.01)
*H01L 21/8238* (2006.01)
(Continued)

(52) U.S. Cl.
CPC ...... *H01L 21/823807* (2013.01); *B82Y 10/00* (2013.01); *H01L 21/02532* (2013.01);
(Continued)

(58) Field of Classification Search
USPC .......................................... 257/351
See application file for complete search history.

(56) References Cited

U.S. PATENT DOCUMENTS 8,575,009 B2 * 11/2013 Sleight .............. H01L 21/02104
257/E21.324
9,196,715 B2    11/2015 Hirai et al.
(Continued)

OTHER PUBLICATIONS

Zheng, Peng et al., Inserted-oxide FinFET (iFinFET) Design to Extend CMOS Scaling, Department of Electrical Engineering and Computer Sciences, University of California, Berkeley, CA, 2015 (2 pages).

*Primary Examiner* — Brook Kebede
(74) *Attorney, Agent, or Firm* — Lewis Roca Rothgerber Christie LLP

(57) ABSTRACT

A field effect transistor includes a fin having a stack of nanowire-like channel regions including at least first and a second nanowire-like channel regions, source and drain electrodes on opposite sides of the fin, a dielectric separation region including a dielectric material between the first and second nanowire-like channel regions, and a gate stack extending along a pair of sidewalls of the stack of nanowire-like channel regions. The dielectric separation region extending completely from a surface of the second nanowire-like channel region facing the first nanowire-like channel region to a surface of the first nanowire-like channel region facing the second nanowire-like channel region. The gate stack includes a gate dielectric layer and a metal layer on the gate dielectric layer. The metal layer of the gate stack does not extend between the first and second nanowire-like channel regions.

22 Claims, 8 Drawing Sheets

Related U.S. Application Data application No. 15/458,655, filed on Mar. 14, 2017, now Pat. No. 9,853,114.

(60) Provisional application No. 62/559,207, filed on Sep. 15, 2017, provisional application No. 62/412,179, filed on Oct. 24, 2016.

(51) Int. Cl.

| | | |
|---|---|---|
| *H01L 27/092* | (2006.01) | |
| *H01L 29/06* | (2006.01) | |
| *H01L 29/423* | (2006.01) | |
| *H01L 29/786* | (2006.01) | |
| *H01L 21/02* | (2006.01) | |
| *H01L 29/775* | (2006.01) | |
| *B82Y 10/00* | (2011.01) | |
| *H01L 29/66* | (2006.01) | |
| *H01L 27/04* | (2006.01) | |
| *H01L 21/84* | (2006.01) | |

(52) U.S. Cl.
CPC .......... *H01L 21/02603* (2013.01); *H01L 21/823814* (2013.01); *H01L 21/823821* (2013.01); *H01L 21/823828* (2013.01); *H01L 27/04* (2013.01); *H01L 27/092* (2013.01); *H01L 27/0924* (2013.01); *H01L 29/0673* (2013.01); *H01L 29/42364* (2013.01); *H01L 29/42384* (2013.01); *H01L 29/42392* (2013.01); *H01L 29/66439* (2013.01); *H01L 29/775* (2013.01); *H01L 29/78618* (2013.01); *H01L 29/78696* (2013.01); *H01L 21/84* (2013.01); *H01L 27/1203* (2013.01)

(56) References Cited

U.S. PATENT DOCUMENTS

| | | |
|---|---|---|
| 9,252,275 B2 | 2/2016 | Rachmady et al. |
| 9,337,291 B2 | 5/2016 | Pillarisetty et al. |
| 9,343,559 B2 | 5/2016 | Glass et al. |
| 9,391,163 B2 | 7/2016 | Chang et al. |
| 9,412,816 B2 | 8/2016 | Yang et al. |
| 9,461,149 B2 | 10/2016 | Li et al. |
| 9,853,114 B1 * | 12/2017 | Rodder ............ H01L 29/045 |
| 2014/0183452 A1 | 7/2014 | Hirai et al. |
| 2015/0035568 A1 | 2/2015 | Peng et al. |
| 2015/0325481 A1 | 11/2015 | Radosavljevic et al. |
| 2016/0211322 A1 | 7/2016 | Kim et al. |
| 2017/0162453 A1 | 6/2017 | Pillarisetty |

* cited by examiner

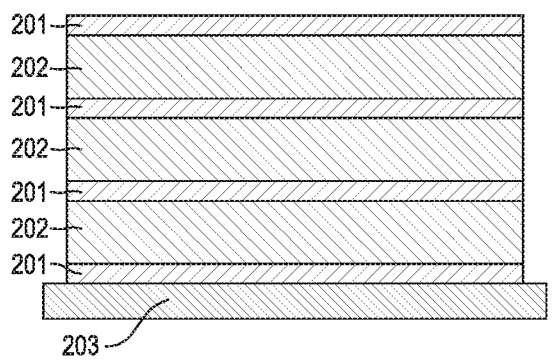
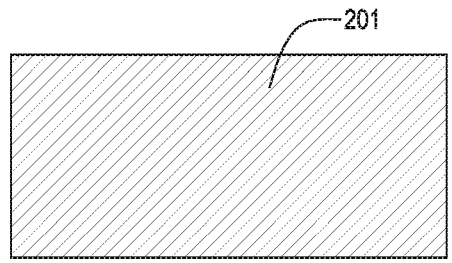
FIG. 2A
FIG. 2B
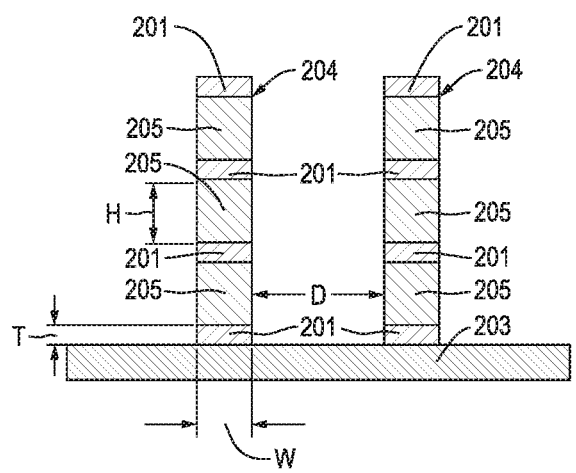
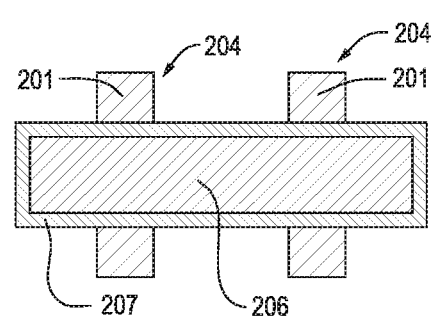
FIG. 2C
FIG. 2D
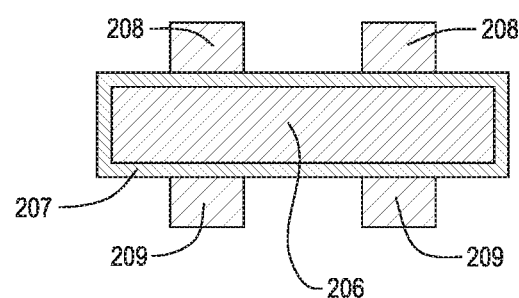
FIG. 2E

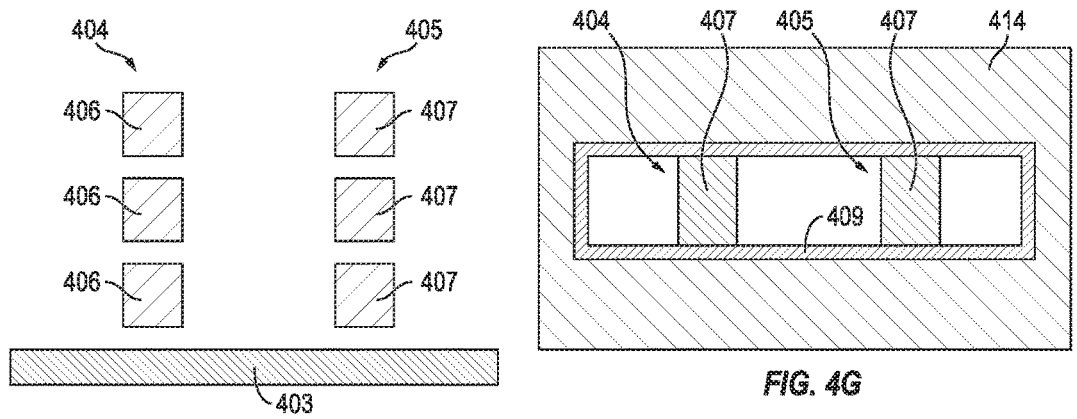
FIG. 4F
FIG. 4G
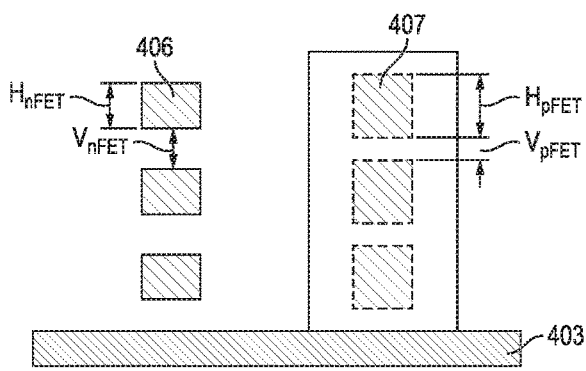
FIG. 4H
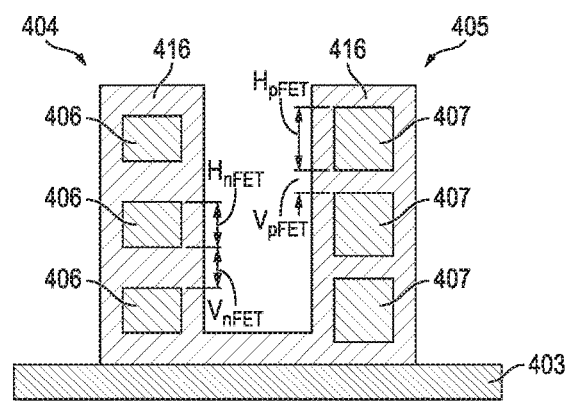
FIG. 4I

FIELD EFFECT TRANSISTOR WITH STACKED NANOWIRE-LIKE CHANNELS AND METHODS OF MANUFACTURING THE SAME

CROSS-REFERENCE TO RELATED APPLICATIONS

The present application is a continuation of U.S. patent application Ser. No. 15/818,657, filed Nov. 20, 2017, which claims priority to and the benefit of U.S. Provisional Application No. 62/559,207, filed Sep. 15, 2017, and is a continuation-in-part of U.S. patent application Ser. No. 15/458,655 (now U.S. Pat. No. 9,853,114), filed Mar. 14, 2017, which claims priority to and the benefit of U.S. Provisional Patent Application No. 62/412,179, entitled "Partial GAA Nanowire-like FET with Stacked Nanowire-Like Channels with Simple Manufacturing Flow," filed Oct. 24, 2016 in the U.S. Patent and Trademark Office, the entire contents of each of which are incorporated herein by reference.

FIELD

The present disclosure relates generally to field effect transistors and methods of manufacturing field effect transistors.

BACKGROUND

Conventional circuits are commonly formed from non-planar "fin" field effect transistors (finFETs). Conventional finFETs generally include multiple vertical fins serving as conducting channel regions. Narrowing the width of the fin channel regions improves gate control of the potential in the fin channel regions. Accordingly, conventional finFETs may be provided with narrow fin widths to reduce short-channel effects and thus enable scaling to shorter gate lengths. However, as gate lengths are scaled, conventional finFETs may fail to provide the desired performance (e.g., $I_{eff}$-$I_{off}$). Additionally, conventional finFETs are not a gate-all-around (GAA) structure, and therefore gate control is only on sides of the fins, which limits further gate length scaling.

Future technologies have contemplated forming circuits from either gate-all-around (GAA) nanowire (NW) FETs or GAA nanosheet (NS) FETs in order to reduce short-channel effects and thereby enable scaling to shorter gate lengths. However, both GAA NW FETs and GAA NS FETs present integration problems. For instance, GAA FETs require an internal spacer to separate the GAA gate metal from the source/drain regions to reduce parasitic capacitance. Additionally, GAA FETs generally require that the GAA gate metal is formed in a narrow vertical region between the bottom of an overlying channel region and the top of an underlying channel region to reduce parasitic capacitance. However, forming the GAA gate metal in a narrow vertical region between the channel regions makes it difficult to achieve the desired threshold voltage ($V_t$).

SUMMARY

The present disclosure is directed to various embodiments of a CMOS circuit. In one embodiment, the CMOS circuit includes a partial GAA nFET and a partial GAA pFET. The partial GAA nFET and the partial GAA pFET each include a fin including a stack of nanowire-like channel regions. The stack includes at least a first nanowire-like channel region and a second nanowire-like channel region stacked on the first nanowire-like channel region. The partial GAA nFET and the partial GAA pFET each also include a dielectric separation region between the first and second nanowire-like channel regions. The dielectric separation region extends completely from a surface of the second nanowire-like channel region facing the first nanowire-like channel region to a surface of the first nanowire-like channel region facing the second nanowire-like channel region. The partial GAA nFET and the partial GAA pFET each also include a source electrode and a drain electrode on opposite sides of the fin. The CMOS circuit also includes a gate stack extending along a pair of sidewalls of the stack of nanowire-like channel regions for each of the partial GAA nFET and the partial GAA pFET. The gate stack includes a gate dielectric layer and a metal layer on the gate dielectric layer. The metal layer of the gate stack does not extend between the first and second nanowire-like channel regions. An nFET channel height of each of the first and second nanowire-like channel regions of the partial GAA nFET is different than a pFET channel height of each of the first and second nanowire-like channel regions of the partial GAA pFET.

The nFET channel height may be less than the pFET channel height. The nFET channel height may be from approximately 2 nm to approximately 6 nm, and the pFET channel height may be from approximately 4 nm to approximately 6 nm. The nFET channel height may be from approximately 3 nm to approximately 4 nm, and the pFET channel height may be from approximately 4 nm to approximately 5 nm.

A height of the dielectric separation region of the partial GAA nFET may different than a height of the dielectric separation region of the partial GAA pFET. The height of the dielectric separation region of the partial GAA nFET may be greater than the height of the dielectric separation region of the pFET.

A first sum of the nFET channel height and a height of the dielectric separation region of the partial GAA nFET may be substantially equal to a second sum of the pFET channel height and a height of the dielectric separation region of the partial GAA pFET. The first and second sums may each be from approximately 5 nm to approximately 12 nm.

The dielectric separation regions of the partial GAA nFET and the partial GAA pFET may each include a portion of the gate dielectric layer of the gate stack. A dielectric material of the dielectric separation region of the partial GAA nFET and the partial GAA pFET may be different than a dielectric material of the gate dielectric layer of the partial GAA nFET and the partial GAA pFET.

The gate dielectric layer may have a thickness from approximately 1 nm to approximately 3 nm.

The first and second nanowire-like channel regions of the partial GAA nFET or the partial GAA pFET may each have a width from approximately 3 nm to approximately 8 nm.

The present disclosure is also directed to various embodiments of a method of forming a CMOS circuit including a partial GAA nFET and a partial GAA pFET. In one embodiment, the method includes forming a stack of alternating sacrificial layers and conducting channel layers on a substrate and etching the stack to form a first fin of the partial GAA nFET and a second fin of the partial GAA pFET. Each of the first and second fins includes a stack of nanowire-like channel regions, and the stack includes at least a first nanowire-like channel region and a second nanowire-like channel region stacked on the first nanowire-like channel region. The method also includes forming source and drain electrodes for the partial GAA nFET and forming source and drain electrodes for the partial GAA pFET. The method further includes masking the second fin of the partial GAA pFET and removing a portion of the stack of nanowire-like channel regions of the first fin such that a height of each of the first and second nanowire-like channel regions of the first fin is less than a height of each of the first and second nanowire-like channel regions of the second fin. The method also includes forming, for each of the first and second fins, a dielectric separation region between the first and second nanowire-like channel regions of the stack of nanowire-like channel regions. The dielectric separation region extends completely from a surface of the second nanowire-like channel region facing the first nanowire-like channel region to a surface of the first nanowire-like channel region facing the second nanowire-like channel region. The method also includes forming a gate stack including a gate dielectric layer and a metal layer on the gate dielectric layer. The gate stack extends along a pair of sidewalls of the stack of nanowire-like channel regions for each of the first and second fins. For each of the first and second fins, the metal layer of the gate stack does not extend between the first and second nanowire-like channel regions of the stack of nanowire-like channel regions.

Removing the portion of the stack of nanowire-like channel regions of the first fin may be performed by a strip process, a cleaning process, an ashing process, an etching process, an oxidation process, or combinations thereof.

The dielectric separation region of the first fin or the second fin may be formed during the forming of the gate stack, and the dielectric separation region of the first fin or the second fin may include a portion of the gate dielectric layer of the gate stack. The dielectric separation region of each of the first and second fins may be formed before the forming of the gate stack, and a material of the dielectric separation region of each of the first and second fins may be different than a material of the gate dielectric layer.

Forming the source and drain electrodes of the partial GAA pFET may include depositing an Si buffer layer followed by depositing a layer of SiGe or SiGeB. Forming the source and drain electrodes of the partial GAA nFET may include depositing an Si layer.

The conducting channel layers may include Si, the sacrificial layers may include SiGe, and the Ge content of the SiGe may be from approximately 10% to approximately 50%.

The method may also include removing a portion of the stack of nanowire-like channel regions of the second fin. The portion of the stack of nanowire-like channel regions of the first fin that is removed may be greater than the portion of the stack of nanowire-like channel regions of the second fin that is removed.

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

BRIEF DESCRIPTION OF THE DRAWINGS

These and other features and advantages of embodiments of the present disclosure will become more apparent by reference to the following detailed description when considered in conjunction with the following drawings. In the drawings, like reference numerals are used throughout the figures to reference like features and components. The figures are not necessarily drawn to scale.

FIGS. 2A-2B depict a schematic cross-sectional view and a schematic top view, respectively, of a task of a method of forming a FET according to one embodiment of the present disclosure;

FIGS. 2C-2D depict a schematic cross-sectional view and a schematic top view, respectively, of another task of the method of forming the FET according to one embodiment of the present disclosure;

FIG. 2E depicts a schematic top view of a further task of the method of forming the FET according to one embodiment of the present disclosure;

FIGS. 4F-4G depict a schematic cross-sectional view and a schematic top view, respectively, of another task of the method of forming the CMOS circuit according to one embodiment of the present disclosure;

FIG. 4H depicts a schematic cross-sectional view of a further task of the method of forming the CMOS circuit according to one embodiment of the present disclosure;

FIGS. 4I-4J depict a schematic cross-sectional view and a schematic top view, respectively, of another task of the method of forming the CMOS circuit according to one embodiment of the present disclosure;

DETAILED DESCRIPTION

Figure 1A:
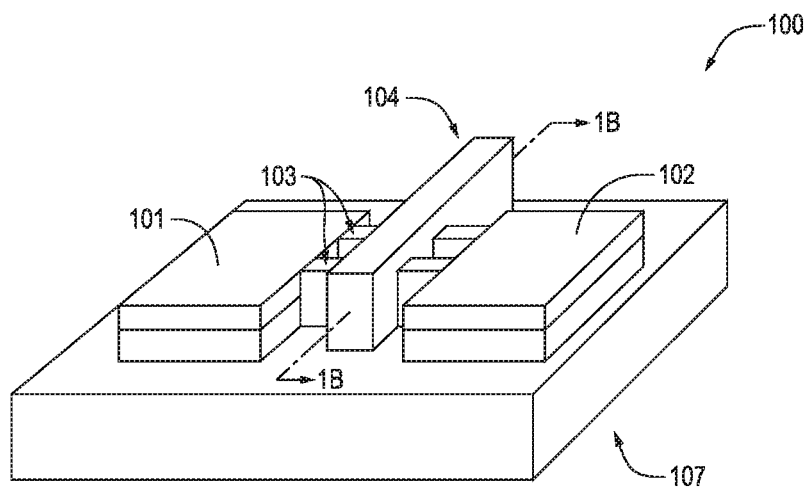
FIGS. 1A-1B are a schematic perspective view and a schematic cross-sectional view, respectively, of a field effect transistor (FET) according to one embodiment of the present disclosure.

The present disclosure is directed to various embodiments of a field effect transistor (FET) and methods of manufacturing the same. The FETs of the present disclosure include a stack of nanowire-like channels and a gate stack including a dielectric layer and a metal layer. According to one or more embodiments of the present disclosure, the dielectric layer of the gate stack extends completely around each of the nanowire-like channels, whereas the metal layer of the gate stack extends along sides of the nanowire-like channels, but does not extend between adjacent nanowire-like channels in the stack of nanowire-like channels. Accordingly, the FETs of the present disclosure are partial-GAA nanowire-like FETs (i.e., partial GAA NW-like FETs). Providing the full gate stack (i.e., the dielectric layer and the metal layer) along the sides of the nanowire-like channels affords improved control of the channel potential compared to conventional finFETs due to gate coupling to each nanowire-like channel through the dielectric layer at the top and bottom of each nanowire-like channel in addition to the gate coupling to each nanowire-like channel through the dielectric layer along the sides of each nanowire-like channel. The FETs of the present disclosure are configured to enable scaling to shorter gate lengths compared to conventional FETs by improving gate control of the potential in the conducting fin channel regions. The FETs of the present disclosure are also configured to enable these shorter gate lengths without creating the integration problems associated with conventional full gate-all-around (GAA) nanosheet FETs and full GAA nanowire FETs.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1B:
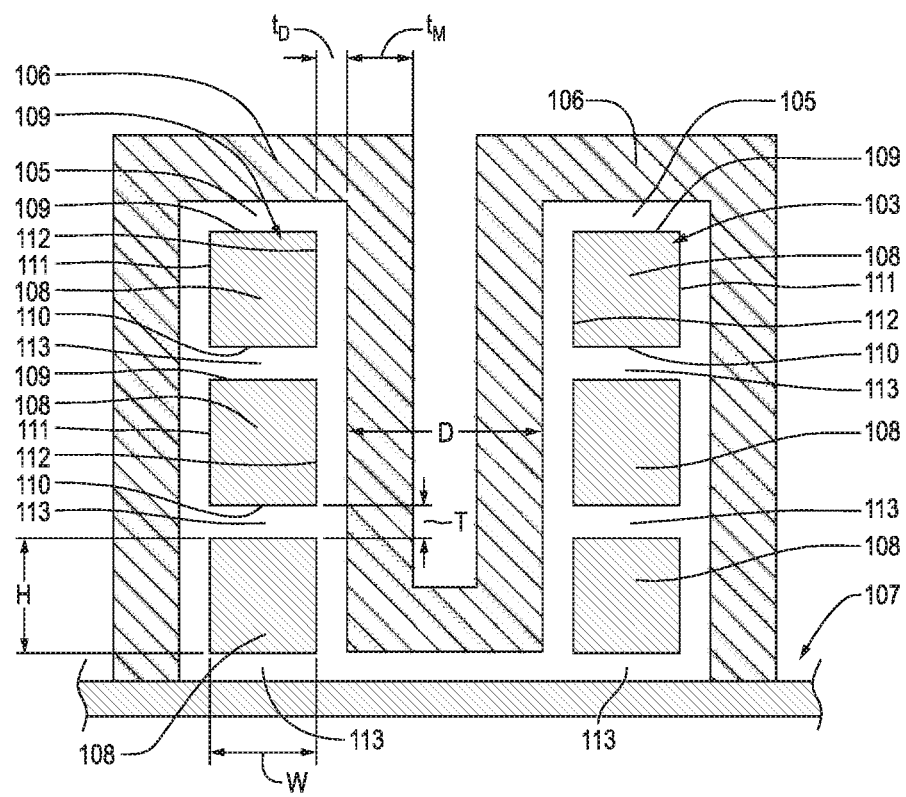

With reference now to FIGS. 1A-1B, a field effect transistor (FET) 100 according to one embodiment of the present disclosure includes a source electrode 101, a drain electrode 102, at least one fin 103 extending between the source and drain electrodes 101, 102, and a gate stack 104 including a gate dielectric layer 105 and a metal layer 106 on the dielectric layer 105. The source and drain electrodes 101, 102, the fin 103, and the gate stack 104 are formed on a substrate 107 (e.g., a bulk-silicon substrate or a silicon-on-insulator (SOI) substrate). As illustrated in FIG. 1B, each of the fins 103 is divided or separated into a stack of discrete nanowire-like channel regions 108. Although in the illustrated embodiment the stack includes three nanowire-like channel regions 108, in one or more embodiments, the stack may include any other suitable number of nanowire-like channel regions 108, such as two channel regions or more than three channel regions. In one or more embodiments, the nanowire-like channel regions 108 may be strained.

As illustrated in FIG. 1B, the gate dielectric layer 105, or a portion of the gate dielectric layer 105, of the gate stack 104 extends completely around each of the nanowire-like channel regions 108 (i.e., the gate dielectric layer 105, or a portion of the gate dielectric layer 105, of the gate stack 104 extends along an upper surface 109, a lower surface 110, and a pair of opposing sidewalls or side surfaces 111, 112 of each of the nanowire-like channel regions 108). Accordingly, in the illustrated embodiment, for each pair of adjacent nanowire-like channel regions 108, the gate dielectric layer 105 or a portion of the gate dielectric layer 105 of the gate stack 104 separates the upper surface 109 of the underlying nanowire-like channel region 108 from the lower surface 110 of the overlying nanowire-like channel region 108. Additionally, in the illustrated embodiment, the metal layer 106 of the gate stack 104 extends along the side surfaces 111, 112 of the nanowire-like channel regions 108 and along the upper surface 109 of the uppermost nanowire-like channel region 108 (i.e., the metal layer 106 extends around or covers the nanowire-like channel regions 108 of the fin 103) but the metal layer 106 does not extend between adjacent nanowire-like channel regions 108 or between the lowermost nanowire-like channel region 108 and the substrate 107. Accordingly, in the illustrated embodiment, the full gate stack 104 (i.e., the gate dielectric layer 105 and the metal layer 106) does not extend fully or completely around each of the nanowire-like channel regions 108 such that the FET 100 of the present disclosure is a partial gate-all-around (GAA) FET rather than a full GAA FET. Providing the full gate stack 104 along the side surfaces 111, 112 of the nanowire-like channels 108 affords improved control of the channel potential compared to a conventional finFET structure due to gate coupling to each nanowire-like channel region 108 through the gate dielectric layer 105 along the upper and lower surfaces 109, 110 of each nanowire-like channel 108 in addition to the gate coupling to each nanowire-like channel region 108 through the gate dielectric layer 105 along the side surfaces 111, 112 of each of the nanowire-like channel regions 108.

In one or more embodiments, the gate dielectric layer 105 of the gate stack 104 may not extend, or may not substantially extend, between adjacent nanowire-like channel regions 108 and the FET 100 may include a separate dielectric layer vertically separating adjacent nanowire-like channel regions 108. The separate dielectric layer may be formed from a dielectric material different than a dielectric material of the gate dielectric layer 105 of the gate stack 104. That is, the dielectric layer may extend along the upper and lower surfaces 109, 110 of the nanowire-like channel regions 108 and the gate dielectric layer 105 may extend along the side surfaces 111, 112 of the nanowire-like channel regions 108 such that the dielectric constant of the dielectric layer extending between adjacent nanowire-like channel regions 108 (e.g., along upper and lower surfaces 109, 110 of the nanowire-like channel regions 108) is different than the dielectric constant of the gate dielectric layer 105 extending along the side surfaces 111, 112 of the nanowire-like channel regions 108. Accordingly, the FET 100 includes one or more separation regions 113 vertically separating adjacent nanowire-like channel regions 108 that are formed of a dielectric material that may be the same as or different than the dielectric material of the gate dielectric layer 105 of the gate stack 104. Providing one or more dielectric layers extending along the upper and lower surfaces 109, 110 of the nanowire-like channel regions 105 that have a different dielectric constant than the gate dielectric layer 105 extending along the side surfaces 111, 112 of the nanowire-like channel regions 108 may provide improved electron transport along the upper and lower surfaces 109, 110 of the nanowire-like channel regions 108 and/or more desired gate coupling to the upper and lower surfaces 109, 110 of the nanowire-like channel regions 108.

In one or more embodiments, the nanowire-like channel regions 108 may have a channel width W from approximately 3 nm to approximately 8 nm and a channel height H from approximately 4 nm to approximately 12 nm and the portions of the gate dielectric layer 105 of the gate stack 104 extending between the nanowire-like channel regions 108 may have a thickness T from approximately 2 nm to approximately 6 nm such that adjacent nanowire-like channel regions 108 of the fin 103 are separated by approximately 2 nm to approximately 6 nm. In one or more embodiments, the nanowire-like channel regions 108 may have a channel width W from approximately 4 nm to approximately 6 nm and a channel height H from approximately 4 nm to approximately 8 nm and the portions of the gate dielectric layer 105 of the gate stack 104 extending between the nanowire-like channel regions 108 may have a thickness T from approximately 2 nm to approximately 4 nm such that adjacent nanowire-like channel regions 108 of the fin 103 are separated by approximately 2 nm to approximately 4 nm. Providing the nanowire-like channel regions 108 with a channel height H from approximately 4 nm to approximately 8 nm (e.g., from approximately 3 nm to approximately 7 nm) and providing portions of the gate dielectric layer 105 of the gate stack 104 extending between the nanowire-like channel regions 108, which may have with a thickness T from approximately 2 nm to approximately 4 nm, may achieve improved electron transport in the nanowire-like channel regions 108 of the fin 103 due to increased injection velocity from quantum confinement. Additionally, this increased injection velocity is not substantially offset by increased phonon or surface-roughness scattering rates. Providing the nanowire-like channel regions 108 with a channel height H from approximately 4 nm to approximately 8 nm (e.g., from approximately 3 nm to approximately 7 nm) and providing portions of the gate dielectric layer 105 of the gate stack 104 extending between the nanowire-like channel regions 108, which may have with a thickness T from approximately 2 nm to approximately 4 nm, may further achieve improved electrostatic control of the nanowire-like channel regions 108 of the fin 103 due to coupling of fringing fields from the gate stack 104 to the upper and lower surfaces 109, 110 of the nanowire-like channel regions 108, thereby reducing short-channel effects and enabling scaling to shorter gate lengths if desired.

In the illustrated embodiment, the FET 100 also includes a second fin 103 including a second stack of nanowire-like channel regions 108 adjacent to the first fin 103 including the first stack of nanowire-like channel regions 108. In the illustrated embodiment, the gate stack 104 (i.e., the gate dielectric layer 105 and the metal layer 106) extend around the second fin 103 in the same manner that the gate stack 104 extends around the first fin 103. In one or more embodiments, the FET 100 may include any other suitable number of fins each including a stack of nanowire-like channel regions 108, such as, for instance, three or more fins. In one or more embodiments, the first fin 103 (i.e., the first stack of nanowire-like channel regions 108) is spaced apart from the second fin 103 (i.e., the second stack of nanowire-like channel regions 108) by a distance D at least as great as the separation distance between adjacent nanowire-like channel regions 108 in the first and second stacks (e.g., the horizontal separation distance D between the first and second stacks of nanowire-like channel regions 108 is at least as great as the thickness T of the portions of the gate dielectric layer 105 vertically separating adjacent nanowire-like channel regions 108). In one or more embodiments, the distance D that the first stack of nanowire-like channel regions 108 is spaced apart from the second stack of nanowire-like channel regions 108 is greater than the separation distance between adjacent nanowire-like channel regions 108 in the first and second fins 103.

Additionally, in one or more embodiments, the thickness T of the portions of the gate dielectric layer 105 vertically separating adjacent nanowire-like channel regions 108 is different than a thickness $t_D$ of the portions of the gate dielectric layer 105 extending along the side surfaces 111, 112 of the nanowire-like channel regions 108 (e.g., the thickness T of the portions of the gate dielectric layer 105 extending along the upper and lower surfaces 109, 110 of the nanowire-like channel regions 108 is different than the thickness $t_D$ of the portions of the gate dielectric layer 105 extending along the side surfaces 111, 112 of the nanowire-like channel regions 108). That is, the gate dielectric layer 105 may have a non-uniform (e.g., varying) thickness. In one or more embodiments, the thickness T of the portions of the gate dielectric layer 105 vertically separating adjacent nanowire-like channel regions 108 is equal to or less than approximately twice the thickness $t_D$ of the portions of the gate dielectric layer 105 extending along the side surfaces 111, 112 of the nanowire-like channel regions 108.

In one or more embodiments, the thickness $t_D$ of the gate dielectric layer 105 of the gate stack 104 may be from approximately 1 nm to approximately 3 nm and the thickness $t_M$ of the metal layer 106 of the gate stack 104 may be greater than a thickness of a work-function tuning metal layer having a thickness from approximately 1 nm to approximately 5 nm.

In one or more embodiments, the FET 100 may include one or more n-type FETs and/or one or more p-type FETs. In one or more embodiments, the nanowire-like channel regions 108 may be formed of silicon (Si), the upper and lower surfaces 109, 110 of the nanowire-like channel regions 108 have a (100) orientation, and the side surfaces 111, 112 of the nanowire-like channel regions 108 have a (110) orientation. In one or more embodiments, the nanowire-like channel regions 108 may be formed of Si, the upper and lower surfaces 109, 110 of the nanowire-like channel regions 108 have a (110) orientation, and the side surfaces 111, 112 of the nanowire-like channel regions 108 have a (110) orientation. In one or more embodiments, the FET 100 includes an n-type FET having nanowire-like channel regions 108 formed of Si, a p-type FET having nanowire-like channel regions 108 formed of silicon germanium (SiGe), the upper and lower surfaces 109, 110 of the nanowire-like channel regions have a (110) orientation or a (100) orientation, and the side surfaces 111, 112 of the nanowire-like channel regions 108 have a (110) orientation.

In one or more embodiments in which the FET 100 includes both n-type FETs and p-type FETs, the orientation of the upper and lower surfaces 109, 110 of the nanowire-like channel regions 108 of the n-type FETs may be the same as the orientation of the upper and lower surfaces 109, 110 of the nanowire-like channel regions 108 of the p-type FETs. In one or more embodiments in which the FET 100 includes both n-type FETs and p-type FETs, the nanowire-like channel regions 108 of both the n-type FETs and the p-type FETs may be formed of Si, the upper and lower surfaces 109, 110 of the nanowire-like channel regions 108 of the n-type FET may have a (100) orientation, and the upper and lower surfaces 109, 110 of the nanowire-like channel regions 108 of the p-type FET may have a (110) orientation. In one or more embodiments in which the FET 100 includes both n-type FETs and p-type FETs, the nanowire-like channel regions 108 of both the n-type FETs and the p-type FETs may be formed of Ge, the upper and lower surfaces 109, 110 of the nanowire-like channel regions 108 of the n-type FET may have a (111) orientation, and the upper and lower surfaces 109, 110 of the nanowire-like channel regions 108 of the p-type FET may have a (110) orientation. In one or more embodiments in which the FET 100 includes both n-type FETs and p-type FETs, the nanowire-like channel regions 108 of the n-type FETs may be made from Si, Ge, SiGe, or a group III-V material, the nanowire-type channel regions 108 of the p-type FETs may be made of Si, Ge, or SiGe, and the surface orientation of upper and lower surfaces 109, 110 of the nanowire-like channels 108 of the n-type or p-type FETs may be Si (110), Ge (110) n-type Si FET (100), p-type Si FET (110), n-type Ge FET (111), or p-type Ge FET (110).

In one or more embodiments, the gate dielectric layer 105 of the gate stack 104 may be formed of a high-K dielectric material, such as, for example, a material having a κ greater than 10 (e.g., $HFO_2$). In one or more embodiments, the nanowire-like channel regions 108 may be formed of Si, SiGe, Ge, or a group III-V material, such as indium gallium arsenide (InGaAs), indium arsenide (InAs), or indium antimonide (InSb).

In one or more embodiments, the metal layer 106 of the gate stack 104 may include a work-function tuning metal layer. In one or more embodiments, the metal layer 106 of the gate stack 104 may include a low-resistance metal cladding layer adjacent to the work-function tuning metal layer.

Figure 2F:
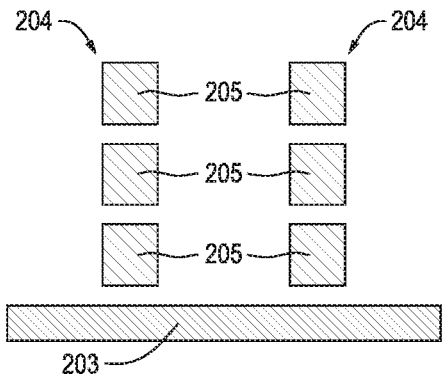
FIGS. 2F-2G depict a schematic cross-sectional view and a schematic top view, respectively, of another task of the method of forming the FET according to one embodiment of the present disclosure.

FIGS. 2A-2K depict tasks of a method of forming a field effect transistor (FET) according to one embodiment of the present disclosure. As illustrated in FIGS. 2A-2B, the method includes a task of layer-by-layer deposition of a stack of alternating sacrificial layers 201 and conducting channel layers 202 on a silicon substrate 203 such that the lowermost sacrificial layer 201 is directly on the silicon substrate 203 and each conducting channel layer 202 is between a pair of sacrificial layers 201. The silicon substrate 203 may include a (100) or (110) silicon (Si) substrate. Although in the illustrated embodiment the task includes depositing three conducting channel layers 202 and four sacrificial layers 201, in one or more embodiments, the task may include depositing any other suitable number of conducting channel layers 202 and sacrificial layers 201 depending on the desired size of the FET (e.g., the task may include depositing one or more conducting channel layers 202). In one or more embodiments, the sacrificial layers 201 are formed of SiGe and the conducting channel layers 202 are formed of Si. In one or more embodiments, the SiGe material of the sacrificial layers 201 may include Ge in the range from approximately 10% to approximately 50% (e.g., from approximately 15% to approximately 35% or from approximately 20% to approximately 30%). In one or more embodiments, the sacrificial layers 201 have a thickness from approximately 2 nm to approximately 6 nm (e.g., approximately 2 nm to approximately 4 nm) and the conducting channel layers 202 have a thickness from approximately 4 nm to approximately 12 nm (e.g., a thickness from approximately 4 nm to approximately 8 nm). In one or more embodiments, the conducting channel layers 202 and the sacrificial layers 201 may not be formed of Si and SiGe, respectively. In one or more embodiments, the conducting channel layers 202 and the sacrificial layers 201 may be any other suitable materials whereby the sacrificial layers 201 can be selectively etched relative to conducting channel layers 202 for n-type FETs, p-type FETs, or both n-type and p-type FETs. In one or more embodiments in which the FET is an n-type FET, the materials of the conducting channel layers 202 and the sacrificial layers 201 may be Group III-V materials, such as InGaAs and InP, respectively. In one or more embodiments, the materials of the conducting channel layers 202 and the sacrificial layers 201 may be Group IV materials, such as Ge and SiGe, respectively, for either n-type FETs or p-type FETs. In one or more embodiments in which the FET is a p-type FET, the materials of the conducting channel layers 202 and the sacrificial layers 201 may be Group IV materials, such as SiGe and Si, respectively.

In one or more embodiments, the conducting channel layers 202 may be formed of Si, upper and lower surfaces of the conducting channel layers 202 have a (100) orientation, and sidewalls of the conducting channel layers 202 have a (110) orientation. In one or more embodiments, the conducting channel layers 202 may be formed of Si, the upper and lower surfaces of the conducting channel layers 202 have a (110) orientation, and the sidewalls of the conducting channel layers 202 have a (110) orientation. In one or more embodiments in which the FET includes both n-type and p-type FETs, the n-type FET has conducting channel layers 202 formed of Si, the p-type FET has conducting channel layers 202 formed of SiGe, the upper and lower surfaces of the conducting channel layers 202 have a (110) orientation or a (100) orientation, and the sidewalls of the conducting channel layers 202 have a (110) orientation. In one or more embodiments in which the FET includes both n-type FETs and p-type FETs, the orientation of the upper and lower surfaces of the conducting channel layers 202 of the n-type FETs may be the same as the orientation of the upper and lower surfaces of the conducting channel layers 202 of the p-type FETs. In one or more embodiments in which the FET includes both n-type FETs and p-type FETs, the conducting channel layers 202 of both the n-type FETs and the p-type FETs may be formed of Si, the upper and lower surfaces of the conducting channel layers 202 of the n-type FET may have a (100) orientation, and the upper and lower surfaces of the conducting channel layers 202 of the p-type FET may have a (110) orientation. In one or more embodiments in which the FET includes both n-type FETs and p-type FETs, the conducting channel layers 202 of both the n-type FETs and the p-type FETs may be formed of Ge, the upper and lower surfaces of the conducting channel layers 202 of the n-type FET may have a (111) orientation, and the upper and lower surfaces of the conducting channel layers 202 of the p-type FET may have a (110) orientation. In one or more embodiments in which the FET includes both n-type FETs and p-type FETs, the conducting channel layers 202 of the n-type FETs may be made from Si, Ge, SiGe, or a group III-V material, the conducting channel layers 202 of the p-type FETs may be made of Si, Ge, or SiGe, and the surface orientation of upper and lower surfaces of the conducting channel layers 202 of the n-type or p-type FETs may be Si (110), Ge (110) n-type Si FET (100), p-type Si FET (110), n-type Ge FET (111), or p-type Ge FET (110).

In one or more embodiments in which the conducting channel layers 202 are formed of materials from different groups (e.g., Group IV, Group III-V) and/or in which the conducting channel layers 202 do not have the same surface orientation, the conducting channel layers 202 may be formed by epitaxial growth from a starting material on an insulator and/or a separate epitaxial growth from a bulk substrate.

With reference now to FIGS. 2C-2D, the method according to one embodiment of the present disclosure includes a task of patterning and etching the stack of conducting channel layers 202 and sacrificial layers 201 to form at least one fin 204. The task of patterning and etching the stack of alternating conducting channel layers 202 and the sacrificial layers 201 may be performed by any suitable process or technique, such as, for instance, lithography, sidewall-image transfer, or dry etching. In the illustrated embodiment, the task includes forming two adjacent fins 204, although in one or more embodiments, the task may include forming any other desired number of fins 204, such as one fin or three or more fins. As illustrated in FIG. 2C, each of the fins 204 includes a stack of nanowire-like channel regions 205 formed from the material of the conducting channel layers 202. The task of patterning and etching the stack includes forming the one or more fins with the desired channel height H, the desired channel width W and, in the case of two or more fins, forming the fins 204 with the desired horizontal separation distance D between adjacent fins 204. In one or more embodiments, the method includes forming two or more fins 204 in which the horizontal separation distance D between two adjacent fins 204 is at least as great as the thickness T of the sacrificial layers 201. In one or more embodiments, the task may include forming the one or more fins 204 with a channel width W from approximately 3 nm to approximately 8 nm, such as, for example, a channel width W from approximately 4 nm to approximately 6 nm. The channel width W of the one or more fins 204 may vary depending on the type of device into which the FET is designed to be incorporated. In one or more embodiments, the task of forming the one or more fins 204 may include a single mask task and a single etch task or two or more mask and etch tasks. Additionally, in one or more embodiments, the task may include an etch (e.g., a dry etch) that is not selective to either the channel layer material or the sacrificial layer material. Furthermore, the task may be utilized to form one or more fins 204 for nFETs and pFETs.

With continued reference to FIG. 2D, the method also includes a task of forming a dummy gate 206 (e.g., a dummy gate formed of oxide/poly-Si/nitride) and forming an external sidewall spacer 207 by any process known in the art, such as nitride deposition.

The method also includes a task of masking source and drain regions and etching the one or more fins 204 in regions not protected by the dummy gate 206 and the external sidewall spacer 207 formed during the task described above with reference to FIGS. 2C-2D. In one or more embodiments, the etching of the one or more fins 204 proceeds all the way down to, or into, the silicon substrate 203.

With reference now to FIG. 2E, the method also includes a task of forming source and drain regions 208, 209 (e.g., nFET source and drain regions or pFET source and drains) by, for example, epitaxial deposition. In one or more embodiments, the source and drain regions 208, 209 may be nFET source and drain regions formed from any suitable material, such as Si, SiP, or SiCP. In one or more embodiments, the nFET source and drain regions 208, 209 may be formed of Si having impurities, such as phosphorous (P) or carbon (C). During the task of epitaxial deposition, the source and drain regions 208, 209 will form from a bottom and along sidewalls of the etched region, thereby connecting the source and drain regions 208, 209 to the nanowire-like channel regions 205 and the sacrificial layers 201. Additionally, in one or more embodiments, during the task of epitaxial deposition, the nFET source and drain regions 208, 209 grow from the silicon substrate 203 to enable strain in the channel regions.

The method also includes a task of removing the masking of the source and drain regions 208, 209 (i.e., unmasking the source and drain regions 208, 209).

In one or more embodiments, the task of forming the source and drain regions 208, 209 may include a task of forming pFET source and drain regions by, for example, epitaxial deposition. In one or more embodiments, the task of forming the pFET source and drain regions 208, 209 includes depositing a buffer layer of Si having a thickness, for example, from approximately 1 nm to approximately 5 nm (e.g., approximately 1.5 nm), followed by depositing a layer of SiGe, SiGeB, or a similar material. In one or more embodiments, the task may include depositing a SiGe layer having impurities, such as boron (B) or tin (Sn). In one or more embodiments, a portion of the buffer layer adjacent to the sacrificial layers 201 may be formed from SiGe. In one or more embodiments, a portion of the SiGe of the pFET source and drain regions 208, 209 adjacent to the SiGe sacrificial layers 201 may have the same or different concentration of Ge as the SiGe sacrificial layers 201. In one or more embodiments in which the sacrificial layers 201 are formed of Si, the task of forming the pFET source and drain regions 208, 209 may not include depositing the buffer layer of Si, although in one or more embodiments, the task of forming the pFET source and drain regions 208, 209 may include depositing the buffer layer of Si even when the sacrificial layers 201 are formed of Si. During the task of epitaxial deposition, the pFET source and drain regions 208, 209 will form from a bottom and along sidewalls of the etched region, thereby connecting the source and drain regions 208, 209 to the nanowire-like channel regions 205 and the sacrificial layers 201. Additionally, in one or more embodiments, during the task of epitaxial deposition, the pFET source and drain regions 208, 209 grow from the silicon substrate 203 to enable strain in the channel regions.

Figure 2G:
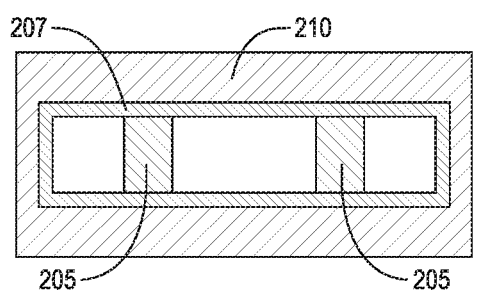
Figure 2H:
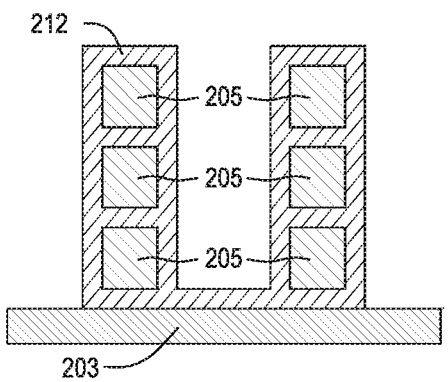
FIGS. 2H-2I depict a schematic cross-sectional view and a schematic top view, respectively, of another task of the method of forming the FET according to one embodiment of the present disclosure.
Figure 2I:
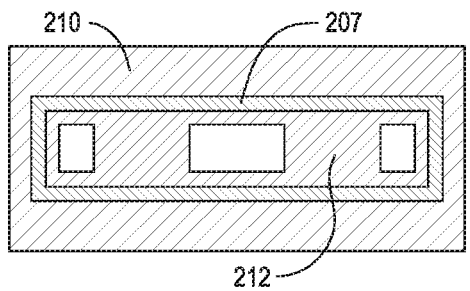
Figure 2J:
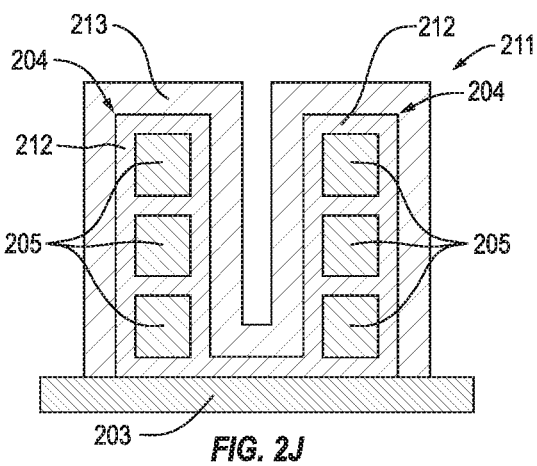
FIGS. 2J-2K depict a schematic cross-sectional view and a schematic top view, respectively, of a further task of the method of forming the FET according to one embodiment of the present disclosure.
Figure 2K:
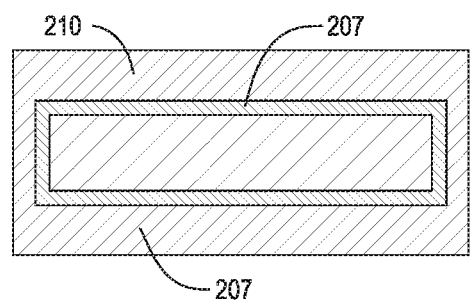

With reference now to FIGS. 2F-2G, the method also includes tasks of depositing an interlayer dielectric (ILD) 210, performing chemical mechanical planarization (CMP) to a top of the dummy gate 206, and then removing the dummy gate 206 to expose the one or more fins 204. With continued reference to FIGS. 2F-2G, the method also includes a task of removing the SiGe sacrificial layers 201 by wet or dry etch that is selective with respect to Si, including selective with respect to the Si nanowire-like channel regions 205. The selective etching of the sacrificial layers 201 will not etch into the pFET or nFET source and drain regions 208, 209 because these regions include an Si material adjacent to the sacrificial layers 201. In one or more embodiments in which the sacrificial layers 201 have sufficient dielectric properties (e.g., for nFET, the sacrificial layers 201 are formed of SiGe or InP), the method may not include the task of removing the sacrificial layers 201 before a subsequent task, described below, of forming a gate stack 211. In one or more embodiments, the method may include partially removing the sacrificial layers 201 prior to the task of forming the gate stack 211.

With reference now to FIGS. 2H-2K, the method also includes forming the gate stack 211 by forming a gate dielectric layer 212 (see FIGS. 2H-2I) and then forming a metal layer 213 (FIGS. 2J-2K) on the gate dielectric layer 212 by any process or processes known in the art, such as atomic-layer deposition (ALD). During the task of forming the gate stack 211, the gate dielectric layer 212, or a portion of the gate dielectric layer 212, fills the regions of the removed sacrificial layers 201 (i.e., the gate dielectric layer 212, or a portion of the gate dielectric layer 212, fills the regions previously occupied by the sacrificial layers 201). The gate dielectric layer 212 also forms over each of the one or more fins 204 (i.e., the gate dielectric layer 212 forms along the sides of the nanowire-like channel regions 205 and along an upper surface of the uppermost nanowire-like channel region 205 in each fin 204). Accordingly, following the task of forming the gate stack 211, each of the fins 204 includes a stack of two or more nanowire-like channel regions 205 separated by portions of the gate dielectric layer 212. Additionally, during the task of forming the gate stack 211, the metal layer 213 forms on the gate dielectric layer 212 and around each of the one or more fins 204 such that the metal layer 213 extends along the sidewalls of the nanowire-like channel regions 205 and along the upper surface of the uppermost nanowire-like channel region 205 of each fin 204. Since the gate dielectric layer 212, or a portion of the gate dielectric layer 212, fills the regions of the removed sacrificial layers 201, the metal layer 213 of the gate stack 211 does not deposit into the regions of the removed sacrificial layers 201. Accordingly, following the task of forming the gate stack 211, the metal layer 213 of the gate stack 211 does not extend between the nanowire-like channel regions 205 (i.e., unlike the gate dielectric layer 212, the metal layer 213 does not extend along the upper and lower surfaces of each of the nanowire-like channel regions 205).

In one or more embodiments, the method may include a task of forming (e.g., depositing) a dielectric layer in the regions of the removed sacrificial layers 201 and removing (e.g., etching) portions of the dielectric layer along the sidewalls of the nanowire-like channel regions 205 before the task of forming the gate stack 211 (e.g., the method may include forming a dielectric layer along the upper and lower surfaces of the nanowire-like channel regions 205 before forming the gate stack 211). The dielectric material of the dielectric layer is different than the dielectric material of the gate dielectric layer 212 of the gate stack 211 (e.g., the dielectric layer has a dielectric constant different than the dielectric constant of the gate dielectric layer 212). Accordingly, following the task of forming the gate stack 211, the dielectric constant of the dielectric layer extending between adjacent nanowire-like channel regions 205 (e.g., along upper and lower surfaces of the nanowire-like regions 205) is different than the dielectric constant of the gate dielectric layer extending along the sidewalls of the nanowire-like channel regions 205. Providing dielectric layers with different dielectric constants along the upper and lower surfaces of the nanowire-like channel regions 205 compared to along the sidewalls of the nanowire-like channel regions 205 may provide improved electron transport along the upper and lower surfaces of the nanowire-like channel regions 205 and/or more desired gate coupling to the upper and lower surfaces of the nanowire-like channel regions 205.

The method also includes completing formation of the FET and a circuit including one or more of the FETs by tasks known in the art, including CMP tasks to enable gate metal only in the removed dummy gate regions, followed by a task of contact formation, and a task of back-end-of-line (BEOL) formation. Additionally, in one or more embodiments, the method may include forming partial gate-all-around (GAA) FETS, conventional full GAA FETs, and/or conventional finFETs on the same chip/circuit as the FET formed according to the tasks of the present disclosure described above.

Figure 3A:
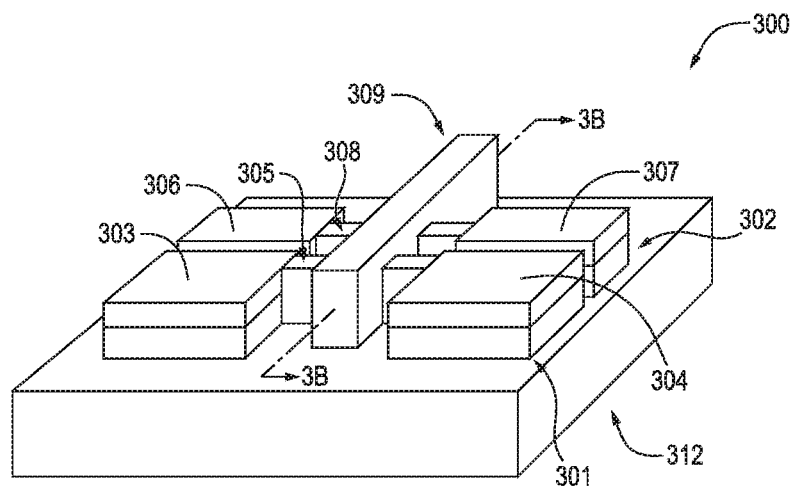
FIGS. 3A-3B are a schematic perspective view and a schematic cross-sectional view, respectively, of a CMOS circuit according to one embodiment of the present disclosure.
Figure 3B:
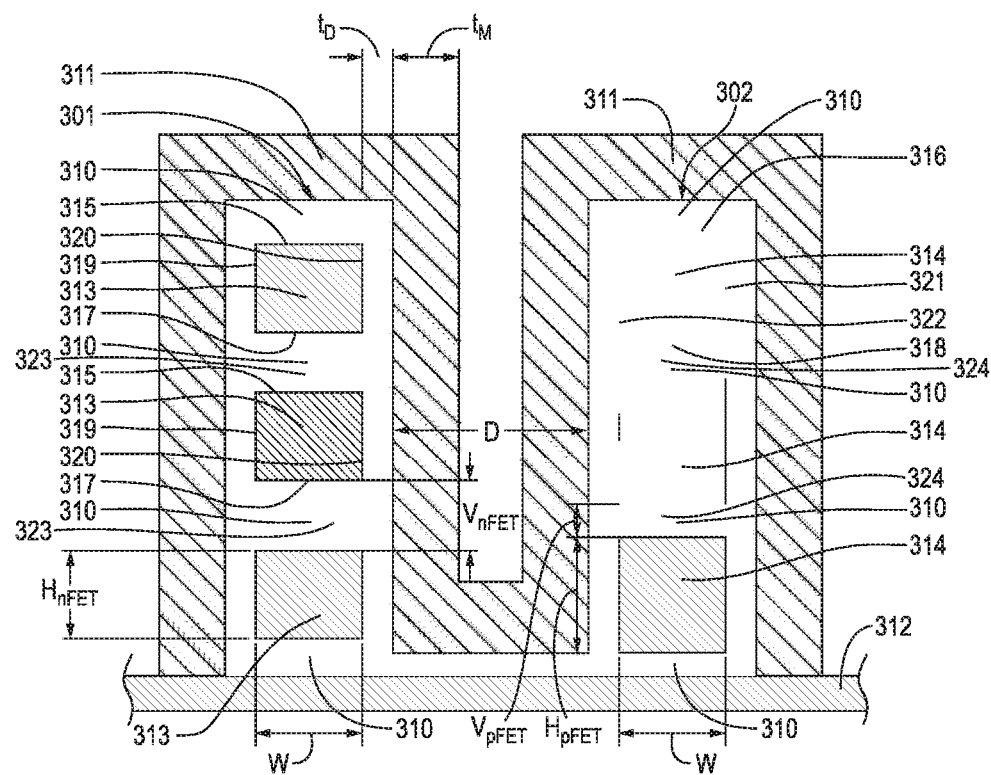

With reference now to FIGS. 3A-3B, a CMOS circuit 300 according to one embodiment of the present disclosure includes an nFET 301 and a pFET 302. The nFET 301 includes a source electrode 303, a drain electrode 304, and a fin 305 extending between the source and drain electrodes 303, 304. In one or more embodiments, the source and drain electrodes 303, 304 of the nFET 301 include Si, SiP, or SiCP. The pFET 302 includes a source electrode 306, a drain electrode 307, and a fin 308 extending between the source and drain electrodes 306, 307. In one or more embodiments, the source and drain electrodes 306, 307 of the pFET 302 include an Si buffer layer and a layer of SiGe or SiGeB on the Si buffer layer. In one or more embodiments, the Si buffer layer may have a thickness from approximately 1 nm to approximately 5 nm. The CMOS circuit 300 also includes a gate stack 309 including a gate dielectric layer 310 and a metal layer 311 on the gate dielectric layer 310. The source electrodes 303, 306, the drain electrodes 304, 307, the fins 305, 308, and the gate stack 309 are formed on a substrate 312 (e.g., a bulk-silicon substrate or a silicon-on-insulator (SOI) substrate). As illustrated in FIG. 3B, the fin 305 of the nFET 301 and the fin 308 of the pFET 302 are each divided or separated into a stack of discrete nanowire-like channel regions 313, 314, respectively. Although in the illustrated embodiment the stacks each include three nanowire-like channel regions 313, 314, in one or more embodiments, the stacks may each include any other suitable number of nanowire-like channel regions 313, 314, such as two channel regions or more than three channel regions. In one or more embodiments, the nanowire-like channel regions 313, 314 may be strained.

As illustrated in FIG. 3B, the gate dielectric layer 310, or a portion of the gate dielectric layer 310, of the gate stack 309 extends completely around each of the nanowire-like channel regions 313, 314 (i.e., the gate dielectric layer 310, or a portion of the gate dielectric layer 310, of the gate stack 309 extends along an upper surface 315, 316, a lower surface 317, 318, and a pair of opposing sidewalls or side surfaces 319, 320, 321, 322, respectively, of each of the nanowire-like channel regions 313, 314). Accordingly, in the illustrated embodiment, for each pair of adjacent nanowire-like channel regions 313, 314, the gate dielectric layer 310 or a portion of the gate dielectric layer 310 of the gate stack 309 separates the upper surface 315, 316 of the underlying nanowire-like channel region 313, 314 from the lower surface 317, 318 of the overlying nanowire-like channel region 313, 314. Additionally, in the illustrated embodiment, the metal layer 311 of the gate stack 309 extends along the side surfaces 319, 320, 321, 322 of the nanowire-like channel regions 313, 314 and along the upper surface 315, 316 of the uppermost nanowire-like channel region 313, 314 (i.e., the metal layer 311 extends around or covers the nanowire-like channel regions 313, 314 of the fins 305, 308) but the metal layer 311 does not extend between adjacent nanowire-like channel regions 313, 314 or between the lowermost nanowire-like channel region 313, 314 and the substrate 312. Accordingly, in the illustrated embodiment, the full gate stack 309 (i.e., the gate dielectric layer 310 and the metal layer 311) does not extend fully or completely around each of the nanowire-like channel regions 313, 314 such that the nFET 301 and the pFET 302 of the present disclosure are a partial gate-all-around (GAA) nFET and a partial GAA pFET, respectively, rather than full GAA FETs. Providing the full gate stack 309 along the side surfaces 319, 320, 321, 322 of the nanowire-like channels 313, 314 affords improved control of the channel potential compared to a conventional finFET structure due to gate coupling to each nanowire-like channel region 313, 314 through the gate dielectric layer 309 along the upper and lower surfaces 315, 316, 317, 318 of each nanowire-like channel region 313, 314 in addition to the gate coupling to each nanowire-like channel region 313, 314 through the gate dielectric layer 310 along the side surfaces 319, 320, 321, 322 of each of the nanowire-like channel regions 313, 314.

In one or more embodiments, the gate dielectric layer 310 of the gate stack 309 may not extend, or may not substantially extend, between adjacent nanowire-like channel regions 313, 314 and the CMOS circuit 300 may include a separate dielectric layer vertically separating adjacent nanowire-like channel regions 313, 314. The separate dielectric layer may be formed from a dielectric material different than a dielectric material of the gate dielectric layer 310 of the gate stack 309. That is, the dielectric layer may extend along the upper and lower surfaces 315, 316, 317, 318 of the nanowire-like channel regions 313, 314 and the gate dielectric layer 310 may extend along the side surfaces 319, 320, 321, 322 of the nanowire-like channel regions 313, 314 such that the dielectric constant of the dielectric layer extending between adjacent nanowire-like channel regions 313, 314 (e.g., along upper and lower surfaces 315, 316, 317, 318 of the nanowire-like channel regions 313, 314) is different than the dielectric constant of the gate dielectric layer 310 extending along the side surfaces 319, 320, 321, 322 of the nanowire-like channel regions 313, 314. Accordingly, the nFET 301 and the pFET 302 each include one or more separation regions 323, 324, respectively, vertically separating adjacent nanowire-like channel regions 313, 314, respectively, that are formed of a dielectric material that may be the same as or different than the dielectric material of the gate dielectric layer 310 of the gate stack 309. Providing one or more dielectric layers extending along the upper and lower surfaces 315, 316, 317, 318 of the nanowire-like channel regions 313, 314 that have a different dielectric constant than the gate dielectric layer 310 extending along the side surfaces 319, 320, 321, 322 of the nanowire-like channel regions 313, 314 may provide improved electron transport along the upper and lower surfaces 315, 316, 317, 318 of the nanowire-like channel regions 313, 314 and/or more desired gate coupling to the upper and lower surfaces 315, 316, 317, 318 of the nanowire-like channel regions 313, 314.

In the illustrated embodiment, a channel height $H_{nFET}$ of the nanowire-like channel regions 313 in the nFET 301 is different than a channel height $H_{pFET}$ of the nanowire-like channel regions 314 in the pFET 302. In one or more embodiments, the channel height $H_{nFET}$ of the nanowire-like channel regions 313 in the nFET 301 is less than the channel height $H_{pFET}$ of the nanowire-like channel regions 314 in the pFET 302. Additionally, in the illustrated embodiment, the nFET 301 has a vertical separation distance $V_{nFET}$ between adjacent nanowire-like channel regions 313, and the pFET 302 has a vertical separation distance $V_{pFET}$ between adjacent nanowire-like channel regions 314. The vertical separation distance $V_{nFET}$ corresponds to the thickness of the separation regions 323 (e.g., the thickness of the gate dielectric layer 310 between adjacent nanowire-like channel regions 313) and the vertical separation distance $V_{pFET}$ corresponds to the thickness of the separation regions 324 (e.g., the thickness of the gate dielectric layer 310 between adjacent nanowire-like channel regions 314).

In one or more embodiments, the channel height $H_{pFET}$ of the nanowire-like channel regions 314 in the pFET 302 is approximately 5 nm, the channel height $H_{nFET}$ of the nanowire-like channel regions 313 in the nFET 301 is approximately 3 nm, the vertical separation distance $V_{pFET}$ between the nanowire-like channel regions 314 in the pFET 302 is approximately 3 nm, and the vertical separation distance $V_{nFET}$ between the nanowire-like channel regions 313 in the nFET 301 is approximately 5 nm. In one or more embodiments, the channel height $H_{pFET}$ of the nanowire-like channel regions 314 in the pFET 302 is equal to or greater than approximately 4 nm, the channel height $H_{nFET}$ of the nanowire-like channel regions 313 in the nFET 301 is equal to or less than approximately 4 nm, the vertical separation distance $V_{pFET}$ between the nanowire-like channel regions 314 in the pFET 302 is equal to or less than approximately 4 nm, and the vertical separation distance $V_{nFET}$ between the nanowire-like channel regions 313 in the nFET 301 is equal to or greater than approximately 4 nm. In one or more embodiments, the channel height $H_{pFET}$ of the nanowire-like channel regions 314 in the pFET 302 is equal to or greater than approximately 5 nm, the channel height $H_{nFET}$ of the nanowire-like channel regions 313 in the nFET 301 is equal to or less than approximately 5 nm, the vertical separation distance $V_{pFET}$ between the nanowire-like channel regions 314 in the pFET 302 is equal to or less than approximately 3 nm, and the vertical separation distance $V_{nFET}$ between the nanowire-like channel regions 313 in the nFET 301 is equal to or greater than approximately 3 nm. In one or more embodiments, the channel height $H_{pFET}$ of the nanowire-like channel regions 314 in the pFET 302 is approximately 5 nm, the channel height $H_{nFET}$ of the nanowire-like channel regions 313 in the nFET 301 is approximately 4 nm, the vertical separation distance $V_{pFET}$ between the nanowire-like channel regions 314 in the pFET 302 is approximately 3 nm, and the vertical separation distance $V_{nFET}$ between the nanowire-like channel regions 313 in the nFET 301 is approximately 4 nm.

In one or more embodiments, a sum of the channel height $H_{pFET}$ and the vertical separation distance $V_{pFET}$ of the pFET 302 and the sum of the channel height $H_{nFET}$ and the vertical separation distance $V_{nFET}$ of the nFET 301 are each approximately 8 nm. In one or more embodiments, a sum of the channel height $H_{pFET}$ and the vertical separation distance $V_{pFET}$ of the pFET 302 and the sum of the channel height $H_{nFET}$ and the vertical separation distance $V_{nFET}$ of the nFET 301 are each approximately 9 nm. In one or more embodiments, a sum of the channel height $H_{pFET}$ and the vertical separation distance $V_{pFET}$ of the pFET 302 and the sum of the channel height $H_{nFET}$ and the vertical separation distance $V_{nFET}$ of the nFET 301 are each from approximately 5 nm to approximately 12 nm.

In one or more embodiments, the channel height $H_{pFET}$ of the nanowire-like channel regions 314 in the pFET 302 is approximately 5 nm, the channel height $H_{nFET}$ of the nanowire-like channel regions 313 in the nFET 301 is approximately 3 nm, the vertical separation distance $V_{pFET}$ between the nanowire-like channel regions 314 in the pFET 302 is approximately 4 nm, and the vertical separation distance $V_{nFET}$ between the nanowire-like channel regions 313 in the nFET 301 is approximately 6 nm. In one or more embodiments, the channel heights $H_{nFET}$, $H_{pFET}$ of the nanowire-like channel regions 313, 314 are each approximately 5 nm, and the vertical separation distances $V_{nFET}$, $V_{pFET}$ are each approximately 4 nm. In one or more embodiments, the channel height $H_{pFET}$ of the nanowire-like channel regions 314 in the pFET 302 is equal to or greater than approximately 4 nm, the channel height $H_{nFET}$ of the nanowire-like channel regions 313 in the nFET 301 is equal to or less than approximately 4 nm, the vertical separation distance $V_{pFET}$ between the nanowire-like channel regions 314 in the pFET 302 is equal to or less than approximately 5 nm, and the vertical separation distance $V_{nFET}$ between the nanowire-like channel regions 313 in the nFET is equal to or greater than approximately 5 nm. In one or more embodiments, the channel height $H_{pFET}$ of the nanowire-like channel regions 314 in the nFET 302 is equal to or greater than approximately 5 nm, the channel height $H_{nFET}$ of the nanowire-like channel regions 313 in the nFET 302 is equal to or less than approximately 5 nm, the vertical separation distance $V_{pFET}$ between the nanowire-like channel regions 314 in the pFET 302 is equal to or less than approximately 4 nm, and the vertical separation distance $V_{nFET}$ between the nanowire-like channel regions 313 in the nFET 301 is equal to or greater than approximately 4 nm.

In one or more embodiments, the nanowire-like channel regions 313, 314 of the nFET 301 and the pFET 302 may each have a channel width W from approximately 3 nm to approximately 8 nm.

In one or more embodiments, the metal layer 311 of the gate stack 309 may include a work-function tuning metal layer. In one or more embodiments, the metal layer 311 of the gate stack 309 may include a low-resistance metal cladding layer adjacent to the work-function tuning metal layer. In one or more embodiments, a material of the metal layer 311 of the gate stack 309 at the nFET 301 may be different than a material of the metal layer 311 of the gate stack 309 at the pFET 302. In one or more embodiments, a thickness $t_D$ of the gate dielectric layer 310 of the gate stack 309 may be from approximately 1 nm to approximately 3 nm and the thickness $t_M$ of the metal layer 311 of the gate stack 309 may be greater than a thickness of a work-function tuning metal layer having a thickness from approximately 1 nm to approximately 5 nm.

In one or more embodiments, the nanowire-like channel regions 313, 314 may be formed of silicon (Si), the upper and lower surfaces 315, 316, 317, 318 of the nanowire-like channel regions 313, 314 have a (100) orientation, and the side surfaces 319, 320, 321, 322 of the nanowire-like channel regions 313, 314 have a (110) orientation. In one or more embodiments, the nanowire-like channel regions 313, 314 may be formed of Si, the upper and lower surfaces 315, 316, 317, 318 of the nanowire-like channel regions 313, 314 have a (110) orientation, and the side surfaces 319, 320, 321, 322 of the nanowire-like channel regions 313, 314 have a (110) orientation.

Figure 4A:
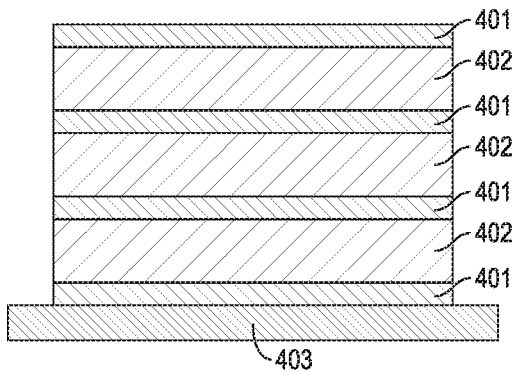
FIGS. 4A-4B depict a schematic cross-sectional view and a schematic top view, respectively, of a task of a method of forming a CMOS circuit according to one embodiment of the present disclosure.
Figure 4B:
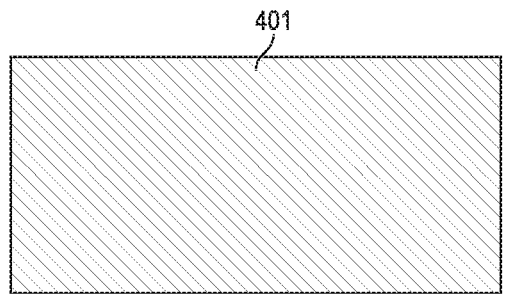

FIGS. 4A-4L depict tasks of a method of forming a CMOS circuit including an nFET and a pFET according to one embodiment of the present disclosure. As illustrated in FIGS. 4A-4B, the method includes a task of layer-by-layer deposition of a stack of alternating sacrificial layers 401 and conducting channel layers 402 on a silicon substrate 403 such that the lowermost sacrificial layer 401 is directly on the silicon substrate 403 and each conducting channel layer 402 is between a pair of sacrificial layers 401. The silicon substrate 403 may include a (100) or (110) silicon (Si) substrate. Although in the illustrated embodiment, the task includes depositing three conducting channel layers 402 and four sacrificial layers 401, in one or more embodiments, the task may include depositing any other suitable number of conducting channel layers 402 and sacrificial layers 401 depending on the desired size of the nFET and the pFET. In one or more embodiments, the sacrificial layers 401 are formed of SiGe and the conducting channel layers 402 are formed of Si. In one or more embodiments, the SiGe material of the sacrificial layers 401 may include Ge in the range from approximately 10% to approximately 50% (e.g., from approximately 15% to approximately 35% or from approximately 20% to approximately 30%). In one or more embodiments, the sacrificial layers 401 have a thickness from approximately 2 nm to approximately 6 nm (e.g., approximately 2 nm to approximately 4 nm) and the conducting channel layers 402 have a thickness from approximately 2 nm to approximately 12 nm (e.g., a thickness from approximately 4 nm to approximately 8 nm).

In one or more embodiments, the conducting channel layers 402 and the sacrificial layers 401 may not be formed of Si and SiGe, respectively, but can be any other suitable materials whereby the sacrificial material can be etched selective to the conducting channel material. In one or more embodiments, the materials of the conducting channel layers 402 and the sacrificial layers 401 may be Group III-V materials, such as InGaAs and InP, respectively. In one or more embodiments, the materials of the conducting channel layers 402 and the sacrificial layers 401 may be Group IV materials, such as Ge and SiGe, respectively. In one or more embodiments, the materials of the conducting channel layers 402 and the sacrificial layers 401 may be Group IV materials, such as SiGe and Si, respectively.

In one or more embodiments, the conducting channel layers 402 may be formed of silicon (Si), upper and lower surfaces of the conducting channel layers 402 have a (100) orientation, and vertical side surfaces of the conducting channel layers 402 have a (110) orientation. In one or more embodiments, the conducting channel layers 402 may be formed of Si, the upper and lower surfaces of the conducting channel layers 402 have a (110) orientation, and the vertical side surfaces of the conducting channel layers 402 have a (110) orientation.

Figure 4C:
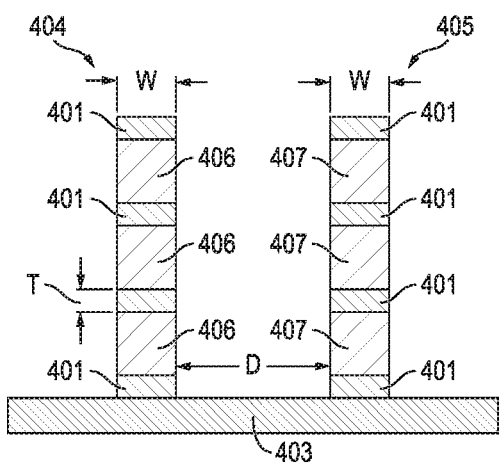
FIGS. 4C-4D depict a schematic cross-sectional view and a schematic top view, respectively, of another task of the method of forming the CMOS circuit according to one embodiment of the present disclosure.
Figure 4D:
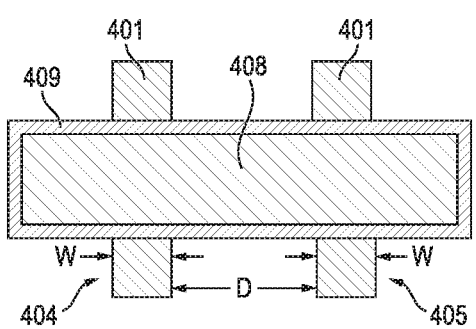

With reference now to FIGS. 4C-4D, the method according to one embodiment of the present disclosure includes a task of patterning and etching the stack of conducting channel layers 402 and sacrificial layers 401 to form a first fin 404 of the nFET and a second fin 405 of the pFET. The task of patterning and etching the stack of alternating conducting channel layers 402 and the sacrificial layers 401 may be performed by any suitable process or technique, such as, for instance, lithography, sidewall-image transfer, or dry etching. As illustrated in FIG. 4C, each of the fins 404, 405 includes a stack of nanowire-like channel regions 406, 407, respectively, formed from the material of the conducting channel layers 402. The task of patterning and etching the stack includes forming the fins 404, 405 with the desired channel width W and the desired horizontal separation distance D between the fins 404, 405. In one or more embodiments, the method includes forming the fins 404, 405 such that the horizontal separation distance D between the fins 404, 405 is at least as great as the thickness T of the sacrificial layers 401. In one or more embodiments, the task may include forming the fins 404, 405 with a channel width W from approximately 3 nm to approximately 8 nm, such as, for example, a channel width W from approximately 4 nm to approximately 6 nm. In one or more embodiments, the task of forming the fins 404, 405 may include a single mask task and a single etch task or two or more mask and etch tasks. Additionally, in one or more embodiments, the task may include an etch (e.g., a dry etch) that is not selective to either the channel layer material or the sacrificial layer material.

With continued reference to FIG. 4D, the method also includes a task of forming a dummy gate 408 (e.g., a dummy gate formed of oxide/poly-Si/nitride) and forming an external sidewall spacer 409 by any process known in the art, such as nitride deposition.

The method also includes a task of masking the second fin 405 of the pFET and etching the first fin 404 of the nFET in regions not protected by the dummy gate 408 and the external sidewall spacer 409 formed during the task described above with reference to FIGS. 4C-4D. In one or more embodiments, the etching of the first fin 404 of the nFET proceeds all the way down to, or into, the silicon substrate 403.

Figure 4E:
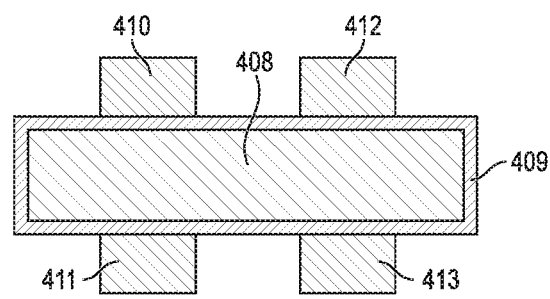
FIG. 4E depicts a schematic top view of a further task of the method of forming the CMOS circuit according to one embodiment of the present disclosure.
Figure 4J:
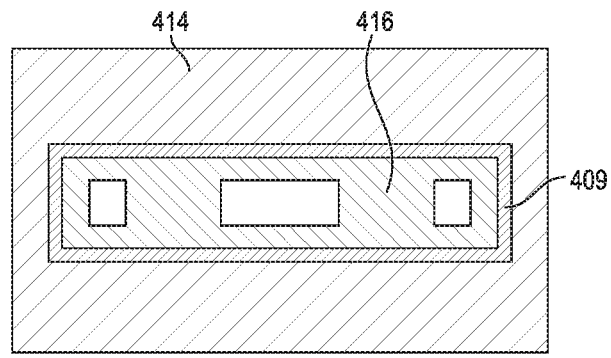
Figure 4K:
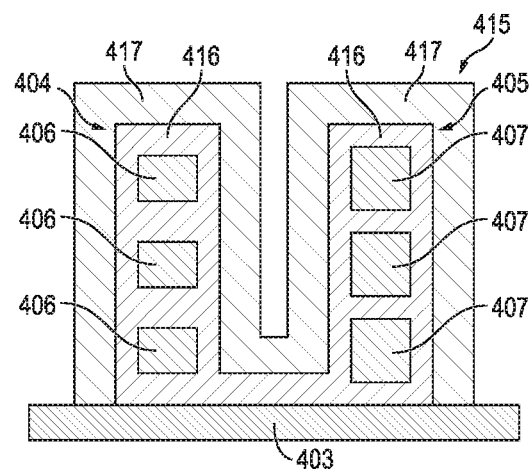
FIGS. 4K-4L depict a schematic cross-sectional view and a schematic top view, respectively, of a further task of the method of forming the CMOS circuit according to one embodiment of the present disclosure.
Figure 4L:
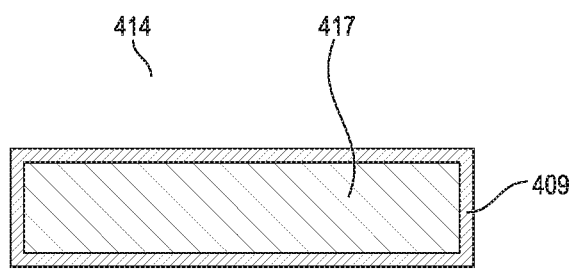

With reference now to FIG. 4E, the method also includes a task of forming nFET source and drain regions 410, 411 by, for example, epitaxial deposition. In one or more embodiments, the nFET source and drain regions 410, 411 may be formed from any suitable material, such as Si, SiP, or SiCP. In one or more embodiments, the nFET source and drain regions 410, 411 may be formed of Si having impurities, such as phosphorous (P) or carbon (C). During the task of epitaxial deposition, the nFET source and drain regions 410, 411 will form from a bottom and along sidewalls of the etched region, thereby connecting the nFET source and drain regions 410, 411 to the nanowire-like channel regions 406 and the sacrificial layers 401 of the first fin 404. Additionally, in one or more embodiments, during the task of epitaxial deposition, the nFET source and drain regions 410, 411 grow from the silicon substrate 403 to enable strain in the channel regions. In one or more embodiments, prior to the forming of the nFET source and drain regions 410, 411, recess regions in the sacrificial layers 401 of the first fin 404 may be formed such that the nFET source and drain regions 410, 411 extend further inward, such as, for instance, to achieve lower resistance.

The method also includes a task of removing the masking of the second fin 405 of the pFET (i.e., unmasking the second fin 405) and a task of masking the first fin 404 of the nFET.

With continued reference to the embodiment illustrated in FIG. 4E, the method also includes a task of forming pFET source and drain regions 412, 413 by, for example, epitaxial deposition. In one or more embodiments, the task of forming the pFET source and drain regions 412, 413 includes depositing a buffer layer of Si having a thickness, for example, from approximately 1 nm to approximately 5 nm (e.g., approximately 1.5 nm), followed by depositing a layer of SiGe, SiGeB, or a similar material. In one or more embodiments, the task may include depositing a SiGe layer having impurities, such as boron (B) or tin (Sn). In one or more embodiments, a portion of the buffer layer adjacent to the sacrificial layers 401 may be formed from SiGe. In one or more embodiments, a portion of the SiGe of the pFET source and drain regions 412, 413 adjacent to the SiGe sacrificial layers 401 may have the same or different concentration of Ge as the SiGe sacrificial layers 401. In one or more embodiments in which the sacrificial layers 401 are formed of Si, the task of forming the pFET source and drain regions 412, 413 may not include depositing the buffer layer of Si, although in one or more embodiments, the task of forming the pFET source and drain regions 412, 413 may include depositing the buffer layer of Si even when the sacrificial layers 401 are formed of Si. During the task of epitaxial deposition, the pFET source and drain regions 412, 413 will form from a bottom and along sidewalls of the etched region, thereby connecting the pFET source and drain regions 412, 413 to the nanowire-like channel regions 407 and the sacrificial layers 401. Additionally, in one or more embodiments, during the task of epitaxial deposition, the pFET source and drain regions 412, 413 grow from the silicon substrate 403 to enable strain in the channel regions. In one or more embodiments, prior to the forming of the pFET source and drain regions 412, 413, recess regions in the sacrificial layers 401 may be formed such that the pFET source and drain regions 412, 413 extend further inward, such as, for instance, to achieve lower resistance.

In one or more embodiments, the tasks of forming the pFET source and drain regions 412, 413 and the nFET source and drain regions 410, 411 may be reversed. For instance, in one or more embodiments, the method may include tasks of masking the first fin 404 of the nFET, forming the pFET source and drain regions 412, 413, unmasking the first fin 404, masking the second fin 405 of the pFET, and then forming the nFET source and drain regions 410, 411.

With reference now to FIGS. 4F-4G, the method also includes tasks of depositing an interlayer dielectric (ILD) 414, performing chemical mechanical planarization (CMP) to a top of the dummy gate 408, and then removing the dummy gate 408 to expose the first and second fins 404, 405 of the nFET and the pFET, respectively.

With continued reference to FIGS. 4F-4G, the method also includes a task of removing the SiGe sacrificial layers 401 by wet or dry etch that is selective with respect to Si, including selective with respect to the Si nanowire-like channel regions 406, 407. The selective etching of the sacrificial layers 401 will not etch into the nFET and pFET source and drain regions 410, 411, 412, 413 because these regions include an Si material adjacent to the sacrificial layers 401.

With reference now to FIG. 4H, the method also includes a task of masking the second fin 405 of the pFET (e.g., performing a second or subsequent masking of the second fin 405 of the pFET). The method also includes a task of removing a portion of each of the nanowire-like channel regions 406 of the first fin 404 (e.g., removing upper and lower portions of each of the nanowire-like channel regions 406 of the first fin 404). The task of removing a portion of each of the nanowire-like channel regions 406 of the first fin 404 may be performed by any suitable process or processes, such as, for instance, strip, cleaning, ashing, etching, and/or oxidation processes. Following the task of removing a portion of each of the nanowire-like channel regions 406 of the first fin 404, each of the nanowire-like channel regions 406 of the first fin 404 has a height $H_{nFET}$ that is less than a height $H_{pFET}$ of each of the nanowire-like channel regions 407 of the second fin 405. Additionally, in the illustrated embodiment, following the task of removing a portion of each of the nanowire-like channel regions 406 of the first fin 404, a vertical separation distance $V_{nFET}$ between adjacent nanowire-like channel regions 406 in the first fin 404 is greater than a vertical separation distance $V_{pFET}$ between adjacent nanowire-like channel regions 407 in the second fin 405.

In one or more embodiments, the method may include a task of masking the first fin 404 of the nFET (e.g., performing a second or subsequent masking of the first fin 404 of the pFET), and a task of removing a portion of each of the nanowire-like channel regions 407 of the second fin 405 (e.g., removing upper and lower portions of each of the nanowire-like channel regions 407 of the second fin 405). In one or more embodiments, the portion of the nanowire-like channel regions 407 of the second fin 405 that is removed (e.g., etched away) is less than the portion of the nanowire-like channel regions 406 of the first fin 404 that is removed such that the height $H_{nFET}$ of the nanowire-like channel regions 406 of the first fin 404 is less than the height $H_{pFET}$ of each of the nanowire-like channel regions 407 of the second fin 405.

In one or more embodiments, following the task of removing a portion of each of the nanowire-like channel regions 406 of the first fin 404, the channel height $H_{pFET}$ of the nanowire-like channel regions 407 in the pFET is approximately 5 nm, the channel height $H_{nFET}$ of the nanowire-like channel regions 406 in the nFET is approximately 3 nm, the vertical separation distance $V_{pFET}$ between the nanowire-like channel regions 407 in the pFET is approximately 3 nm, and the vertical separation distance $V_{nFET}$ between the nanowire-like channel regions 406 in the nFET is approximately 5 nm. In one or more embodiments, the channel height $H_{pFET}$ of the nanowire-like channel regions 407 in the pFET is equal to or greater than approximately 4 nm, the channel height $H_{nFET}$ of the nanowire-like channel regions 406 in the nFET is equal to or less than approximately 4 nm, the vertical separation distance $V_{pFET}$ between the nanowire-like channel regions 407 in the pFET is equal to or less than approximately 4 nm, and the vertical separation distance $V_{nFET}$ between the nanowire-like channel regions 406 in the nFET is equal to or greater than approximately 4 nm. In one or more embodiments, the channel height $H_{pFET}$ of the nanowire-like channel regions 407 in the pFET is equal to or greater than approximately 5 nm, the channel height $H_{nFET}$ of the nanowire-like channel regions 406 in the nFET is equal to or less than approximately 5 nm, the vertical separation distance $V_{pFET}$ between the nanowire-like channel regions 407 in the pFET is equal to or less than approximately 3 nm, and the vertical separation distance $V_{nFET}$ between the nanowire-like channel regions 406 in the nFET is equal to or greater than approximately 3 nm. In one or more embodiments, the channel height $H_{pFET}$ of the nanowire-like channel regions 407 in the pFET is approximately 5 nm, the channel height $H_{nFET}$ of the nanowire-like channel regions 406 in the nFET is approximately 4 nm, the vertical separation distance $V_{pFET}$ between the nanowire-like channel regions 407 in the pFET is approximately 3 nm, and the vertical separation distance $V_{nFET}$ between the nanowire-like channel regions 406 in the nFET is approximately 4 nm.

In one or more embodiments, following the task of removing a portion of each of the nanowire-like channel regions 406 of the first fin 404, a sum of the channel height $H_{pFET}$ and the vertical separation distance $V_{pFET}$ of the pFET and the sum of the channel height $H_{nFET}$ and the vertical separation distance $V_{nFET}$ of the nFET are each approximately 8 nm. In one or more embodiments, a sum of the channel height $H_{pFET}$ and the vertical separation distance $V_{pFET}$ of the pFET and the sum of the channel height $H_{nFET}$ and the vertical separation distance $V_{nFET}$ of the nFET are each approximately 9 nm. In one or more embodiments, a sum of the channel height $H_{pFET}$ and the vertical separation distance $V_{pFET}$ of the pFET and the sum of the channel height $H_{nFET}$ and the vertical separation distance $V_{nFET}$ of the nFET are each from approximately 5 nm to approximately 12 nm.

In one or more embodiments, the channel height $H_{pFET}$ of the nanowire-like channel regions 407 in the pFET is approximately 5 nm, the channel height $H_{nFET}$ of the nanowire-like channel regions 406 in the nFET is approximately 3 nm, the vertical separation distance $V_{pFET}$ between the nanowire-like channel regions 407 in the pFET is approximately 4 nm, and the vertical separation distance $V_{nFET}$ between the nanowire-like channel regions 406 in the nFET is approximately 6 nm. In one or more embodiments, the channel heights $H_{nFET}$, $H_{pFET}$ of the nanowire-like channel regions 406, 407 are each approximately 5 nm, and the vertical separation distances $V_{nFET}$, $V_{pFET}$ are each approximately 4 nm. In one or more embodiments, the channel height $H_{pFET}$ of the nanowire-like channel regions 407 in the pFET is equal to or greater than approximately 4 nm, the channel height $H_{nFET}$ of the nanowire-like channel regions 406 in the nFET is equal to or less than approximately 4 nm, the vertical separation distance $V_{pFET}$ between the nanowire-like channel regions 407 in the pFET is equal to or less than approximately 5 nm, and the vertical separation distance $V_{nFET}$ between the nanowire-like channel regions 406 in the nFET is equal to or greater than approximately 5 nm. In one or more embodiments, the channel height $H_{pFET}$ of the nanowire-like channel regions 407 in the pFET is equal to or greater than approximately 5 nm, the channel height $H_{nFET}$ of the nanowire-like channel regions 406 in the nFET is equal to or less than approximately 5 nm, the vertical separation distance $V_{pFET}$ between the nanowire-like channel regions 407 in the pFET is equal to or less than approximately 4 nm, and the vertical separation distance $V_{nFET}$ between the nanowire-like channel regions 406 in the nFET is equal to or greater than approximately 4 nm.

With reference now to FIGS. 4I-4L, the method also includes forming a gate stack 415 by forming a gate dielectric layer 416 (see FIGS. 4I-4J) and then forming a metal layer 417 (FIGS. 4K-4L) on the gate dielectric layer 416 by any process or processes known in the art, such as atomic-layer deposition (ALD). During the task of forming the gate stack 415, the gate dielectric layer 416, or a portion of the gate dielectric layer 416, fills the regions of the removed sacrificial layers 401 (i.e., the gate dielectric layer 416, or a portion of the gate dielectric layer 416, fills the regions previously occupied by the sacrificial layers 401). The gate dielectric layer 416 also forms over each of the first and second fins 404, 405 of the nFET and the pFET, respectively (i.e., the gate dielectric layer 416 forms along the sides of the nanowire-like channel regions 406, 407 and along an upper surface of the uppermost nanowire-like channel region 406, 407 in each of the first and second fins 404, 405). Accordingly, following the task of forming the gate stack 415, each of the first and second fins 404, 405 includes a stack of two or more nanowire-like channel regions 406, 407, respectively, separated by portions of the gate dielectric layer 416. Additionally, during the task of forming the gate stack 415, the metal layer 417 forms on the gate dielectric layer 416 and around each of the first and second fins 404, 405 such that the metal layer 417 extends along the sidewalls of the nanowire-like channel regions 406, 407 and along the upper surface of the uppermost nanowire-like channel region 406, 407 of each of the first and second fins 404, 405. Since the gate dielectric layer 416, or a portion of the gate dielectric layer 416, fills the regions of the removed sacrificial layers 401, the metal layer 417 of the gate stack 415 does not deposit into the regions of the removed sacrificial layers 401. Accordingly, following the task of forming the gate stack 415, the metal layer 417 of the gate stack 415 does not extend between adjacent nanowire-like channel regions 406, 407 in the first fin 404 or the second fin 405, respectively, or between the lowermost nanowire-like channel region 406, 407 and the substrate 403 (i.e., unlike the gate dielectric layer 416, the metal layer 417 does not extend along the upper and lower surfaces of each of the nanowire-like channel regions 406, 407).

In one or more embodiments, the method may include a task of forming (e.g., depositing) a dielectric layer in the regions of the removed sacrificial layers 401 and removing (e.g., etching) portions of the dielectric layer along the sidewalls of the nanowire-like channel regions 406, 407 before the task of forming the gate stack 415 (e.g., the method may include forming a dielectric layer along the upper and lower surfaces of the nanowire-like channel regions 406, 407 before forming the gate stack 415). The dielectric material of the dielectric layer is different than the dielectric material of the gate dielectric layer 416 of the gate stack 415 (e.g., the dielectric layer has a dielectric constant different than the dielectric constant of the gate dielectric layer 416). Accordingly, following the task of forming the gate stack 415, the dielectric constant of the dielectric layer extending between adjacent nanowire-like channel regions 406, 407 (e.g., along upper and lower surfaces of the nanowire-like regions 406, 407) is different than the dielectric constant of the gate dielectric layer 416 extending along the sidewalls of the nanowire-like channel regions 406, 407. Providing dielectric layers with different dielectric constants along the upper and lower surfaces of the nanowire-like channel regions 406, 407 compared to along the sidewalls of the nanowire-like channel regions 406, 407 may provide improved electron transport along the upper and lower surfaces of the nanowire-like channel regions 406, 407 and/or more desired gate coupling to the upper and lower surfaces of the nanowire-like channel regions 406, 407.

The method also includes completing formation of the CMOS circuit by tasks known in the art, including CMP tasks to enable gate metal only in the removed dummy gate regions, followed by a task of contact formation, and a task of back-end-of-line (BEOL) formation. Additionally, in one or more embodiments, the method may include forming partial gate-all-around (GAA) FETs, conventional full GAA FETs, and/or conventional finFETs on the same chip/circuit as the CMOS circuit formed according to the tasks of the present disclosure described above.

In one or more embodiments, the method of the present disclosure may be utilized to forms fins of different channel widths and channel heights for different sets of devices by performing different layer depositions for the different sets of devices. For instance, layers of Si/SiGe material may be deposited while the pFET region is masked to achieve the desired nFET channel height and spacing. Layers of Si/SiGe material may then be deposited while the nFET region is masked to achieve the desired pFET channel height and spacing. A common sacrificial layer process and common gate dielectric fill of the vertical separation regions may then be utilized as desired.

Figure 5:
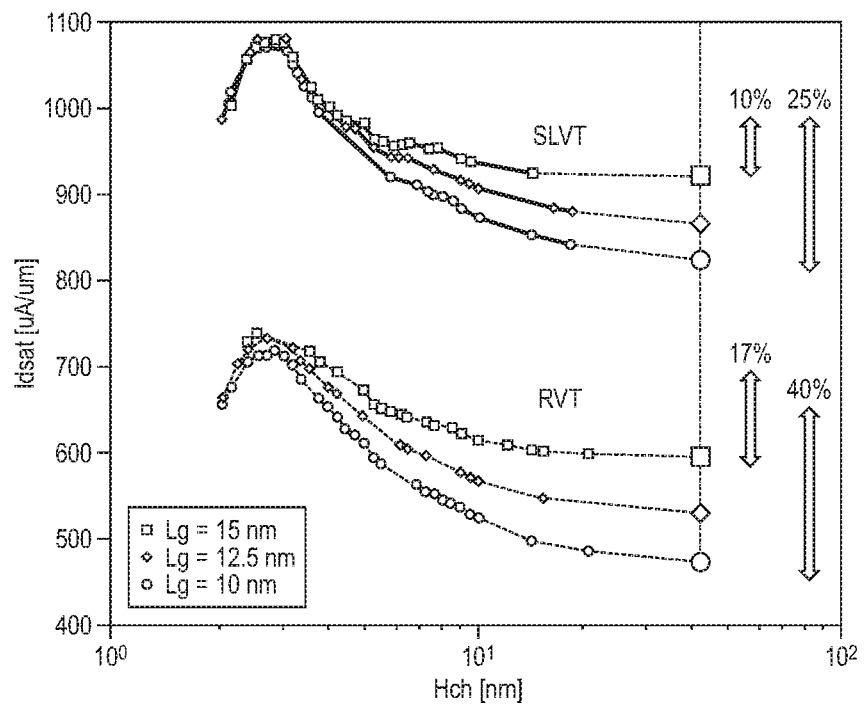
FIG. 5 is a graph depicting the saturated drain current (Idsat) of an nFET of a CMOS circuit according to one embodiment of the present disclosure as a function of channel height.

FIG. 5 is a graph depicting the saturated drain current (Idsat) of an nFET according to one or more embodiments of the present disclosure as a function of the channel height $H_{nFET}$ of the nanowire-like channel regions. As illustrated in FIG. 5, the Idsat of a regular voltage threshold (RVT) nFET having a channel length Lg of approximately 15 nm increases by approximately 17% if the channel height $H_{nFET}$ of the nanowire-like channel regions is decreased from approximately 40 nm to approximately 4 nm (i.e., the Idsat increases from approximately 600 µA/µm with a channel height $H_{nFET}$ of approximately 40 nm to approximately 700 µA/µm with a channel height $H_{nFET}$ of approximately 4 nm). The Idsat of an RVT nFET having a channel length Lg of approximately 10 nm increases by approximately 40% if the channel height $H_{nFET}$ of the nanowire-like channel regions is decreased from approximately 40 nm to approximately 4 nm (i.e., the Idsat increases from approximately 470 µA/µm with a channel height $H_{nFET}$ of approximately 40 nm to approximately 650 µA/µm with a channel height $H_{nFET}$ of approximately 4 nm).

Additionally, as illustrated in FIG. 5, the Idsat of a super low voltage threshold (SLVT) nFET having a channel length Lg of approximately 15 nm increases by approximately 10% if the channel height $H_{nFET}$ of the nanowire-like channel regions is decreased from approximately 40 nm to approximately 4 nm (i.e., the Idsat increases from approximately 910 µA/µm with a channel height $H_{nFET}$ of approximately 40 nm to approximately 1000 µA/µm with a channel height $H_{nFET}$ of approximately 4 nm). The Idsat of a SLVT nFET having a channel length Lg of approximately 10 nm increases by approximately 25% if the channel height $H_{nFET}$ of the nanowire-like channel regions is decreased from approximately 40 nm to approximately 4 nm (i.e., the Idsat increases from approximately 800 µA/µm with a channel height $H_{nFET}$ of approximately 40 nm to approximately 1000 µA/µm with a channel height $H_{nFET}$ of approximately 4 nm).

Figure 6:
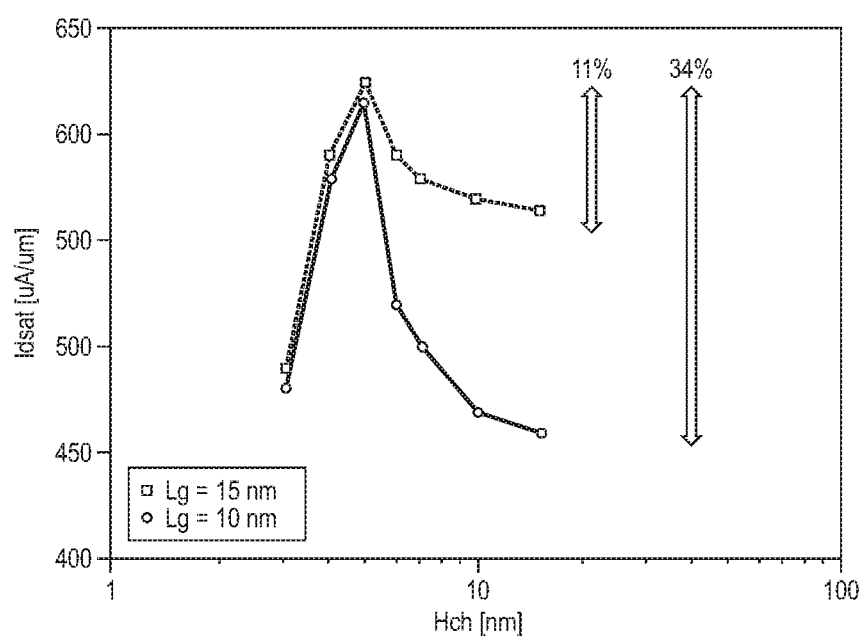
FIG. 6 is a graph depicting the saturated drain current (Idsat) of a pFET of a CMOS circuit according to one embodiment of the present disclosure as a function of channel height.

FIG. 6 is a graph depicting the saturated drain current (Idsat) of a pFET according to one or more embodiments of the present disclosure as a function of the channel height $H_{pFET}$ of the nanowire-like channel regions. As illustrated in FIG. 6, the Idsat of a pFET having a channel length Lg of approximately 15 nm increases by approximately 11% if the channel height $H_{pFET}$ of the nanowire-like channel regions is decreased from approximately 15 nm to approximately 5 nm (i.e., the Idsat increases from approximately 560 µA/µm with a channel height $H_{pFET}$ of approximately 15 nm to approximately 620 µA/µm with a channel height $H_{pFET}$ of approximately 5 nm). The Idsat of a pFET having a channel length Lg of approximately 10 nm increases by approximately 34% if the channel height $H_{pFET}$ of the nanowire-like channel regions is decreased from approximately 15 nm to approximately 5 nm (i.e., the Idsat increases from approximately 460 µA/µm with a channel height $H_{pFET}$ of approximately 15 nm to approximately 620 µA/µm with a channel height $H_{pFET}$ of approximately 5 nm).

What is claimed is:

1. A field effect transistor for an nFET and/or a pFET device, the field effect transistor comprising:
   a fin comprising a stack of nanowire-like channel regions, the stack comprising at least a first nanowire-like channel region and a second nanowire-like channel region stacked on the first nanowire-like channel region;
   a source electrode and a drain electrode on opposite sides of the fin;
   a dielectric separation region comprising a dielectric material between the first and second nanowire-like channel regions, the dielectric separation region extending completely from a surface of the second nanowire-like channel region facing the first nanowire-like channel region to a surface of the first nanowire-like channel region facing the second nanowire-like channel region; and
   a gate stack extending along a pair of sidewalls of the stack of nanowire-like channel regions, the gate stack comprising a gate dielectric layer and a metal layer on the gate dielectric layer,
   wherein the metal layer of the gate stack does not extend between the first and second nanowire-like channel regions.

2. The field effect transistor of claim 1, wherein the dielectric material of the dielectric separation region comprises a portion of the gate dielectric layer of the gate stack.

3. The field effect transistor of claim 1, wherein the dielectric material of the dielectric separation region is different than a dielectric material of the gate dielectric layer.

4. The field effect transistor of claim 1, wherein a lower surface of each nanowire-like channel region of the stack of nanowire-like channel regions has a (100) orientation, and side surfaces of each nanowire-like channel region of the stack of nanowire-like channel regions have a (110) orientation.

5. The field effect transistor of claim 1, wherein the stack of nanowire-like channel regions comprises from 2 nanowire-like channel regions to 10 nanowire-like channel regions.

6. The field effect transistor of claim 1, wherein the stack of nanowire-like channel regions comprises from 3 nanowire-like channel regions to 8 nanowire-like channel regions.

7. The field effect transistor of claim 1, wherein the dielectric separation region has a thickness greater than twice a thickness of the gate dielectric layer of the gate stack.

8. The field effect transistor of claim 1, wherein each of the first and second nanowire-like channel regions has an approximately square cross-sectional shape in a plane perpendicular to a direction from the source electrode to the drain electrode.

9. The field effect transistor of claim 1, wherein each of the first and second nanowire-like channel regions has an approximately rectangular cross-sectional shape in a plane perpendicular to a direction from the source electrode to the drain electrode.

10. The field effect transistor of claim 9, wherein the approximately rectangular cross-sectional shape of each of the first and second nanowire-like channel regions has a first dimension in a direction perpendicular to a substrate and a second dimension in a direction parallel to the substrate, the second dimension being longer than the first dimension.

11. The field effect transistor of claim 9, wherein the approximately rectangular cross-sectional shape of each of the first and second nanowire-like channel regions has a first dimension in a direction perpendicular to a substrate and a second dimension in a direction parallel to the substrate, the first dimension being longer than the second dimension.

12. A CMOS circuit, comprising:
   a partial gate-all-around (GAA) nFET; and
   a partial GAA pFET, wherein the partial GAA nFET and the partial GAA pFET each comprise:
      a fin comprising a stack of nanowire-like channel regions, the stack comprising at least a first nanowire-like channel region and a second nanowire-like channel region stacked on the first nanowire-like channel region;
      a dielectric separation region comprising a dielectric material between the first and second nanowire-like channel regions, the dielectric separation region extending completely from a surface of the second nanowire-like channel region facing the first nanowire-like channel region to a surface of the first nanowire-like channel region facing the second nanowire-like channel region;
   a source electrode and a drain electrode on opposite sides of the fin; and a gate stack extending along a pair of sidewalls of the stack of nanowire-like channel regions, the gate stack comprising a gate dielectric layer and a metal layer on the gate dielectric layer,
wherein the metal layer of the gate stack does not extend between the first and second nanowire-like channel regions, and
wherein an nFET channel height of each of the first and second nanowire-like channel regions of the partial GAA nFET is different than a pFET channel height of each of the first and second nanowire-like channel regions of the partial GAA pFET.

13. The CMOS circuit of claim 12, wherein an nFET channel width of each of the first and second nanowire-like channel regions of the partial GAA nFET is different than a pFET channel width of each of the first and second nanowire-like channel regions of the partial GAA pFET.

14. The CMOS circuit of claim 13, wherein the nFET channel width is greater than the pFET channel width.

15. The CMOS circuit of claim 12, wherein an nFET channel width of each of the first and second nanowire-like channel regions of the partial GAA nFET is substantially the same as a pFET channel width of each of the first and second nanowire-like channel regions of the partial GAA pFET.

16. The CMOS circuit of claim 12, wherein the nFET channel height is less than the pFET channel height.

17. The CMOS circuit of claim 12, wherein the dielectric material of one of the partial GAA nFET and the partial GAA pFET comprises a portion of the gate dielectric layer of the gate stack, and wherein the dielectric material of the other of the partial GAA nFET and the partial GAA pFET is different than a dielectric material of the gate dielectric layer.

18. The CMOS circuit of claim 12, wherein the dielectric material of each of the partial GAA nFET and the partial GAA pFET is different than a dielectric material of the gate dielectric layer.

19. A chip, comprising:
the field effect transistor of claim 1 in one portion of the chip; and
a conventional finFET in another portion of the chip.

20. A method of forming a field effect transistor for an nFET and/or pFET device, the method comprising:
forming a stack of alternating sacrificial layers and conducting channel layers on a substrate;
etching the stack to form at least one fin, the at least one fin comprising a stack of nanowire-like channel regions, the stack comprising at least a first nanowire-like channel region and a second nanowire-like channel region stacked on the first nanowire-like channel region;
forming a source electrode on a first side of the at least one fin; and
forming a drain electrode on a second side of the at least one fin opposite to the first side;
removing the sacrificial layers of the stack;
forming a dielectric separation region comprising a dielectric material along sidewalls of the first and second nanowire-like channel regions and between the first and second nanowire-like channel regions of the stack of nanowire-like channel regions, the dielectric separation region extending completely from a surface of the second nanowire-like channel region facing the first nanowire-like channel region to a surface of the first nanowire-like channel region facing the second nanowire-like channel region;
removing portions of the dielectric separation region along the sidewalls of the first and second nanowire-like channel regions; and
forming a gate stack comprising a gate dielectric layer and a metal layer on the gate dielectric layer,
wherein the gate dielectric layer of the gate stack extends along a pair of sidewalls of the stack of nanowire-like channel regions,
wherein the metal layer of the gate stack does not extend between the first and second nanowire-like channel regions of the stack of nanowire-like channel regions, and
wherein the dielectric material of the dielectric separation region is different than a dielectric material of the gate dielectric layer.

21. The method of claim 20, wherein the conducting channel layers comprise Si and the sacrificial layers comprise SiGe.

22. The method of claim 20, wherein the conducting channel layers comprise SiGe and the sacrificial layers comprise Si.

* * * * *